(12) United States Patent
Winter et al.

(10) Patent No.: US 9,157,149 B2
(45) Date of Patent: *Oct. 13, 2015

(54) BIS(TRIMETHYLSILYL) SIX-MEMBERED RING SYSTEMS AND RELATED COMPOUNDS AS REDUCING AGENTS FOR FORMING LAYERS ON A SUBSTRATE

(71) Applicant: Wayne State University, Detroit, MI (US)

(72) Inventors: Charles H. Winter, Bloomfield Hills, ME (US); Joseph Peter Klesko, Sterling Heights, MI (US)

(73) Assignee: Wayne State University, Detroit, MI (US)

( * ) Notice: Subject to any disclaimer, the term of this patent is extended or adjusted under 35 U.S.C. 154(b) by 118 days.

This patent is subject to a terminal disclaimer.

(21) Appl. No.: 13/930,471

(22) Filed: Jun. 28, 2013

(65) Prior Publication Data

US 2015/0004315 A1    Jan. 1, 2015

(51) Int. Cl.
*C23C 16/00* (2006.01)
*C23C 16/14* (2006.01)
*C23C 16/455* (2006.01)
*C23C 16/18* (2006.01)

(52) U.S. Cl.
CPC ............ *C23C 16/14* (2013.01); *C23C 16/18* (2013.01); *C23C 16/45525* (2013.01); *C23C 16/45553* (2013.01)

(58) Field of Classification Search
CPC ............ C23C 16/45525–16/45555; C23C 16/06–16/18
See application file for complete search history.

(56) References Cited

U.S. PATENT DOCUMENTS

| | | |
|---|---|---|
| 3,562,308 A | 2/1971 | Costa et al. |
| 5,721,014 A | 2/1998 | Fakler et al. |
| 6,020,511 A | 2/2000 | Vaartstra et al. |
| 6,475,276 B1 * | 11/2002 | Elers et al. ............ 117/84 |
| 6,786,936 B2 | 9/2004 | Vaartstra |
| 7,632,351 B2 | 12/2009 | Thompson |
| 2001/0009695 A1 | 7/2001 | Saanila et al. |
| 2002/0013487 A1 | 1/2002 | Norman et al. |
| 2002/0098346 A1 | 7/2002 | Yitzchaik |
| 2005/0097991 A1 | 5/2005 | Sanjurjo et al. |
| 2005/0186342 A1 | 8/2005 | Sager et al. |
| 2006/0134331 A1 | 6/2006 | Thompson |
| 2006/0157863 A1 | 7/2006 | Marsh |
| 2009/0114874 A1 | 5/2009 | Norman et al. |

(Continued)

FOREIGN PATENT DOCUMENTS

| | | |
|---|---|---|
| KR | 10-2010-0061183 A | 6/2010 |
| WO | 2012027357 A2 | 3/2012 |
| WO | 2012/067439 A2 | 5/2012 |

OTHER PUBLICATIONS

Bart, S.C. et al., "Low-Valent α-Diimine Iron Complexes for Catalytic Olefin Hydrogenation," Organometallics 2005, v. 24, pp. 5518-5527.

(Continued)

*Primary Examiner* — Elizabeth Burkhart
(74) *Attorney, Agent, or Firm* — Brooks Kushman P.C.

(57) ABSTRACT

A first compound having an atom in an oxidized state is reacted with a bis(trimethylsilyl) six-membered ring system or related compound to form a second compound having the atom in a reduced state relative to the first compound. The atom in an oxidized state is selected from the group consisting of Groups 2 to 12 of the Periodic Table, As, Sb, Bi, Se, and Te.

26 Claims, 36 Drawing Sheets

(56) References Cited

U.S. PATENT DOCUMENTS

| | | |
|---|---|---|
| 2010/0104755 A1 | 4/2010 | Dussarrat et al. |
| 2010/0181566 A1 | 7/2010 | Lee |
| 2012/0058270 A1* | 3/2012 | Winter et al. ............ 427/255.26 |
| 2012/0231579 A1 | 9/2012 | Quick et al. |
| 2013/0115768 A1 | 5/2013 | Pore et al. |
| 2013/0251903 A1 | 9/2013 | Han |

OTHER PUBLICATIONS d'Alnoncourt, R.N. et al., "The preparation of Cu/Al2O3 catalysts via CVD in a fluidized-bed reactor," Surface and Coatings Technology 201, pp. 9035-904, 2007.

Dieck, H.T. et al., "Reaktionen von Bis(dizadien)eisen(O)," Komplexen. Chem. Ber., 120, pp. 1943-1950, Oct. 2002 (English Abstract).

Gardiner, M.G. et al., "Paramagnetic Bis(1,4-di-tert-butyl-1,4-diazabutadiene) Adducts of Lithium, Magnesium, and Zinc," Inorg. Chem. 1994, 33, pp. 2456-2461.

Ghosh, M. et al., "(α-Diimine)chromium Complexes: Molecular and Electronic Structures; a Combined Experimental and Density Functional Theoretical Study," Inorganic Chem., v. 47, n. 13, (2008), pp. 5963-5970.

Ghosh, M. et al., "A structural, spectroscopic and computational study of the molecular and electronic structure of a [bis(α-diiminato)manganese(II)] π radical complex," Dalton Trans., 2008, pp. 5149-5151.

Gong, Y. et al., "The intra-annular acylamide chelate-coordinated compound: The keto-tautomer of metal (II)-milrinone complex," J. of Molecular Structure 875 (2008), pp. 113-120.

Hassaan, "Mixed ligand complexes of bis(s-methyl-n-arylidene hydrazine carbodithioate) nickel (ii) chelates with some amino acids and nitrogenous heterocycles," J. of Islamic Academy [online] retrieved from http://www.medicaljournal-las.org/3_4Hassaan.pdf on Jul. 1, 2010, pp. 269-272.

International Search Report dated Jul. 1, 2010 from corresponding PCT/US2010/035080 filed May 17, 2010, 2 pgs.

International Search Report for PCT/US2011/048792, Completed by the Korean Patent Office on Feb. 23, 2012, 3 pp.

International Search Report dated Aug. 17, 2012 from corresponding PCT/US12/040892 filed Jun. 5, 2012, pgs.

Kaltsoyannis, N., "Covalency in metal complexes of 1,4-diazabutadiene (dab). A density functional investigation of the electronic structures of [M(dab)2] (M = Li, Ga or Co) and [Th(NH3)NH2)3(dab)]," J. Chem. Soc., Dalton Trans., 1996, pp. 1583-1589.

Kalutarage, L.C. et al., "Low-Temperature Atomic Layer Deposition of Copper Films Using Borane Dimethylamine as the Reducing Co-reagent," Chem. Mater. 2014, 26, pp. 3731-3738.

Kalutarage, L.C. et al., "Synthesis, Structure, and Solution Reduction Reactions of Volatile and Thermally Stable Mid to Late First Row Transition Metal Complexes Containing Hydrazonate Ligands," Inorg. Chem. 2013, v. 52, pp. 5385-5394.

Kalutarage, L.C. et al., "Volatile and Thermally Stable Mid to Late Transition Metal Complexes Containing αImino Alkoxide Ligands, a New Strongly Reducing Coreagent, and Thermal Atomic Layer Deposition of Ni, Co, Fe, and Cr Metal Films," J. Am. Chem. Soc. 2013, 135, pp. 12588-12591.

Karunarathne, M.C. et al., "Exceptional thermal stability and high volatility in mid to late first row transition metal complexes containing carboyhydrazide ligands," Polyhedron 52 (2013), pp. 820-080.

Khusniyarov, M. M. et al., "Reversible Electron Transfer Coupled to Spin Crossover in an Iron Coordination Salt in the Solid State," Angew. Chem. Int. Ed. 2008, 47, pp. 1228-1231.

Khusniyarov, M.M. et al., "Molecular and Electronic Structures of Homoleptic Nickel and Cobalt Complexes with Non-Innocent Bulky Diimine Ligands Derived from Fluorinated 1,4-Diaza-1,3-butadiene (DAD) and Bis(arylimino) acenaphthene (BIAN)," Eur. J. Inorg. Chem. 2006, pp. 2985-2996.

Khusniyarov, M.M. et al., "Tuning the Oxidation Level, the Spin State, and the Degree of Electron Delocalization in Hom- and Heteroleptic Bis(α-diimine)iron Complexes," J. Am. Chem. Soc. 2009, v. 131, pp. 1208-1221.

Knisley, T.J. et al., "Low Temperature Growth of High Purity, Low Resistivity Copper Films by Atomic Layer Deposition," Chem. Mater. 2011, v. 23, pp. 4417-4419.

Knisley, T.J. et al., "Volatility and High Thermal Stability in Mid- to Late-First-Row Transition-Metal Dizazdienyl Complexes," Organometallics 2011, v. 30, pp. 5010-5017.

Kreisel, K.A. et al., "Synthesis, Characterization, and Electronic Structure of Diimine Complexes of Chromium," Inorganic Chem., v. 74, n. 12, (2008), pp. 5293-5303.

Kreisel, K.A. et al., "The Shortest Metal-Metal Bond Yet: Molecular and Electronic Structure of a Dinuclear Chromium Diazadiene Complex," J. Am. Chem. Soc. 2007, v. 129, pp. 14162-14163.

Lim, B.S. et al., "Atomic layer deposition of transition metals," Nature Materials, v. 2, Nov. 2003, pp. 749-754.

Mac-Leod-Carey, D.A. et al., "Bix[2-(2,4-dioxopentan-3-ylidene-κO)-1-(4-methoxy-phenyl)hydrazinato-κN1] copper(II)," Acta Cryst. 2007, E63, pp. m670-m672.

Marten, J. et al., "3-(Arylhydrazono)pentane-2,4-diones and their Complexes with Copper(II) and Nickel(II)—Synthesis and Crystal Structures," Z. Anorg. Allg. Chem. 2005, v. 631, pp. 869-877.

Muresan, N. et al., "Bis(α-diimine)iron Complexes: Electronic Structure Determination by Spectroscopy and Broken Symmetry Density Functional Theoretical Calculations," Inorganic Chem., v. 47, n. 11, (2008), pp. 4579-4590.

Muresan, N. et al., "Bis(α-diimine)nickel Complexes: Molecular and Electronic Structure of Three Members of the Electron-Transfer Series [Ni(L)2]z (z=0, 1+, 2+) (L=2-Phenyl-1,4-bis(isopropyl)-1,4-diazabutadiene). A Combined Experimental and Theoretical Study," Inorganic Chem., v. 46, n. 13, (2007) pp. 5327-5337.

Muresan, N. et al., "Neutral (bis(1,4-diaza-1,3-butadiene)nickel complexes and their corresponding monocations molecular and electronic structures. A combined experimental and density functional theoretical study," Dalton Trans., 2007, pp. 4390-4398.

Nassimbeni, L. et al., "The Crystal and Molecular Structure of the Bis-(5-ethyl-5-isoamylbarbiturato)bis(imidazole) Complex of Nickel(II)," Acta Cryst. (1974), B30, p. 2593-2602.

Pangani et al., "Coordination compounds of lanthanides with acetylhydrazine," Inorganica Chimca Acta, v. 94, issues 1-3, Feb. 1984, Abstract p. 79.

Pettinari, C. et al, "Copper and silver derivatives of scorpionates and related ligands," Polyhedron 23 (2004), pp. 451-469.

Popoff, N. et al., "Shifting from Ziegler-Natta to Phillips-Type Catalyst? A Simple and Safe Access to Reduced Titanium Systems for Ethylene Polymerization," Macromol. Rapid Commun. 2011, 32, pp. 1921-1924.

Rijnberg et al., "A Homologous Series of Homoleptic Zinc Bis(1,4-di-tert-butyl-1,4-diaza-1,3-butadiene) Complexes: Kx(Zn(t-BuNCHCHN-t-Bu)2 and (Zn(t-BuNCHCHN-t-Bu)2))(Otf)x (x=1,2)," Inorg. Chem. 1998, v. 37, pp. 56-63.

Robinson, M.A. et al., "Complexes Derived from Strong Field Ligands. XVII. Electronic Spectra of Octahedral Nickel(II) Complexes with Ligands of the α-Diimine and Closely Related Classes," Inorganic Chem., v. 2, n. 6, (1963), pp. 1178-1181

Saito, T. et al., "1,4-Bis(trimethylsilyl)-,4-diaza-2,5-cyclohexadienes as Strong Salt-Free Reductants for Generating Low-Valent Early Transition Metals with Electron-Donating Ligands," J. Am. Chem. Soc. 2014, 136, pp. 5161-5170.

Svoboda, M. et al., "Bis(diazadien)metal(O)-Komplexe, III [1]1 Nickel(O)-bis(chelate) mit aliphatischen N-Substituenten," Z. Naturforsch. 86b, (1981), pp. 814-822—English Abstract.

Thompson, R.K. "Amidate Complexes of the Group 4 Metals," Synthesis, Reactivity, and Hydroaminiation Catalysis. Thesis, The University of British Columbia. http://hdl.handle.net/2429/1344. Available online Nov. 8, 2008, pp. 1-120.

Tsurugi, H. et al., "Carbon Radical Generation by D0 Tantalum Complexes with α-Diimine Ligands through Ligand-Centered Redox Processes," J. Am. Chem. Soc. 2011, 133, pp. 18673-18683.

(56) References Cited

OTHER PUBLICATIONS

Tsurugi, H. et al., "Salt-Free Reducing Reagent of Bis(trimethylsilyl)cyclohexadiene Mediates Multielectron Reduction of Chloride Complexes of W(VI) and W(IV)," J. Am. Chem. Soc. 2013, 135, pp. 5986-5989.

Vidjayacoumar et al., "Investigation of AlMe3, BEt3, and ZnEt2 as Co-Reagents for Low Temperature Copper Metal ALD/Pulsed-CVD," Chem. Mater. 2010, v. 22, pp. 4844-4853.

Yilmaz, F. et al., "Bis-(5,5'-diethylbarbiturato) Copper(II) and Cadmium(II Complexes with Ethylenediamine. Synthesis Crystal Structures, Spectroscopic and Thermal Characterization of cis-[Cu(barb)2(en] and {[Cd(barb)2(µ-en)] •2H2O)n," Z. Anorg. Allg. Chem. 2005, v. 631, pp. 1536-1540.

Non-Final Office Action mailed Apr. 4, 2014 in U.S. Appl. No. 13/319,793, filed 100/10/2011, 7 pgs.

Non-Final Office Action mailed May 28, 2014 in U.S. Appl. No. 13/493,560 filed Jun. 11, 2012, 7 pgs.

Final Office Action Mailed Sep. 24, 2014 in U.S. Appl. No. 13/493,560, filed Jun. 11, 2012, 23 pgs.

International Search Report, dated Oct. 27, 2014 in PCT/US2014/044669 filed Jun. 27, 2014, 3 pgs.

Authors et al.: Disclosed Anonymously, IP.com Prior Art Database Technical Disclosure, IP.com No. IPCOM000173198D, Jul. 25, 2008.

Non-Final Office Action mailed Aug. 27, 2014 in U.S. Appl. No. 13/818,154, filed Feb. 21, 2013, 9 pgs.

Non-final Office Action mailed Mar. 23, 2015 in U.S. Appl. No. 13/818,154, filed Feb. 21, 2013, 10 pgs.

English Machine Translation of KR1020080120087 published Jun. 7, 2010, 31 pgs.

Non-final Office Action mailed Jan. 30, 2015 in U.S. Appl. No. 14/318,501, filed Jun. 27, 2014, 10 pgs.

* cited by examiner formic acid alkyl carboxylic acid oxalic acid dicarboxylic acids sulfonic acids

HX

Inorganic Acid phosphoric acid phosphorous acid $R^{14}$ = H, $C_1$-$C_8$alkyl, $C_6$-$C_{12}$aryl, $C_1$-$C_8$fluoroalkyl
X = $N_3^-$, $NO_3^-$, halide (e.g., Cl, F, Br)
n = an integer from 1 to 6.

BIS(TRIMETHYLSILYL) SIX-MEMBERED RING SYSTEMS AND RELATED COMPOUNDS AS REDUCING AGENTS FOR FORMING LAYERS ON A SUBSTRATE

STATEMENT REGARDING FEDERALLY SPONSORED RESEARCH OR DEVELOPMENT

The invention was made with Government support under Contract No. CHE-1212574 awarded by NFS. The Government has certain rights to the invention.

FIELD OF THE INVENTION

In at least one aspect, the present invention is related to the formation of metal films from "metalorganic" precursors and a reducing agent.

BACKGROUND OF THE INVENTION

The growth of thin films is a central step in the fabrication of many functional materials and devices. While film growth efforts have been traditionally directed toward films greater than 100 nm, recent trends in several areas are calling for the growth of films ranging in thickness from a few atomic layers up to tens of nanometers.

In the microelectronics area, copper has replaced aluminum as the interconnect material in integrated circuits due to its lower resistivity and higher resistance to electromigration. Ultrathin (2-8 nm) manganese-silicon-oxygen layers have been proposed as replacements for existing nitride-based copper diffusion barrier layers in future devices. Since copper does not nucleate well on $SiO_2$ and other surfaces, it is difficult to deposit copper metal onto the surface features of microelectronic substrates. Accordingly, there has been considerable interest in the formation of seed layers of metals such as chromium, cobalt, and others which adhere better to substrates, and upon which copper films can be subsequently grown.

Atomic layer deposition ("ALD") is a thin film deposition technique that addresses many of the current technological demands. ALD affords inherently conformal coverage and sub-nanometer film thickness control due to its self-limited growth mechanism. In a typical ALD process, a substrate is contacted with a first chemical composition that modifies the substrate for a first predetermined period of time (a pulse). Such modification involves adsorption to the surface of the substrate, reaction with the surface of the substrate, or a combination of adsorption and reaction. A purging gas is introduced to remove any lingering first gaseous chemical composition in the vicinity of the substrate. A second gaseous chemical composition that reacts with the modified substrate surface is introduced for a second predetermined period of time into the vicinity of the substrate to form a portion of the thin film. A purging gas is subsequently introduced to remove any lingering second chemical composition in the vicinity of the substrate. These steps of contacting the substrate with the first chemical composition, purging, contacting the substrate with the second gaseous chemical composition, and purging are usually repeated a plurality of times until a film of desired thickness is coated onto the substrate. Although the prior art ALD processes work well, there is unfortunately only a limited number of chemical precursors having the requisite thermal stability, reactivity, and vapor pressure for ALD.

Accordingly, there is a need for improved methods and reagents for depositing thin films by atomic layer deposition.

SUMMARY OF THE INVENTION

The present invention solves one or more problems of the prior art by providing a method of reducing a compound having an atom in an oxidized state. The method includes a step of reacting a first compound having an atom in an oxidized state with a reducing agent to form a second compound having the atom in a reduced state relative to the first compound. The atom in an oxidized state is selected from the group consisting of Groups 2 to 12 of the Periodic Table, As, Sb, Bi, Se, and Te. The reducing agent is selected from the group consisting of compounds described by formulae IA and IB:

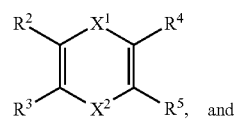

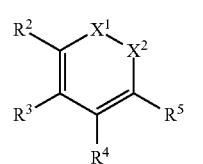

wherein:
$X^1$ is $CR^6(SiR^1R^{1'}R^{1''})$ or $N(SiR^1R^{1'}R^{1''})$;
$X^2$ is $CR^7(SiR^1R^{1'}R^{1''})$ or $N(SiR^1R^{1'}R^{1''})$; and
$R^1, R^{1'}, R^{1''}, R^2, R^3, R^4, R^5, R^6$, and $R^7$ are each independently H, $C_{1-10}$ alkyl, $C_{6-14}$ aryl, or $C_{4-14}$ heteroaryl.

In another embodiment, a method of forming a layer by an atomic layer deposition process is provided. The method includes a step of contacting a substrate with a vapor of a first compound having an atom in an oxidized state to form a first modified surface. The atom in an oxidized state is selected from the group consisting of Groups 2 to 12 of the Periodic Table, As, Sb, Bi, Se, and Te. The first modified surface is optionally contacted with an acid for a second predetermined pulse time to form a second modified surface. The first modified surface or the second modified surface is contacted with a reducing agent for a third predetermined pulse time to form the layer on the substrate. The reducing agent is selected from the group consisting of:

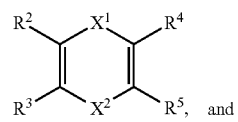

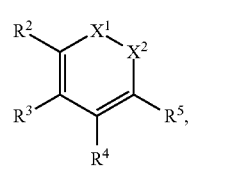

wherein:
$X^1$ is $CR^6(SiR^1R^{1'}R^{1''})$ or $N(SiR^1R^{1'}R^{1''})$;
$X^2$ is $CR^7(SiR^1R^{1'}R^{1''})$ or $N(SiR^1R^{1'}R^{1''})$; and
$R^1, R^{1'}, R^{1''}, R^2, R^3, R^4, R^5, R^6$, and $R^7$ are each independently H, $C_{1-10}$ alkyl, $C_{6-14}$ aryl, or $C_{4-14}$ heteroaryl.

BRIEF DESCRIPTION OF THE DRAWINGS

Exemplary embodiments of the present invention will become more fully understood from the detailed description and the accompanying drawings, wherein.

DESCRIPTION OF THE INVENTION

Figure 1:
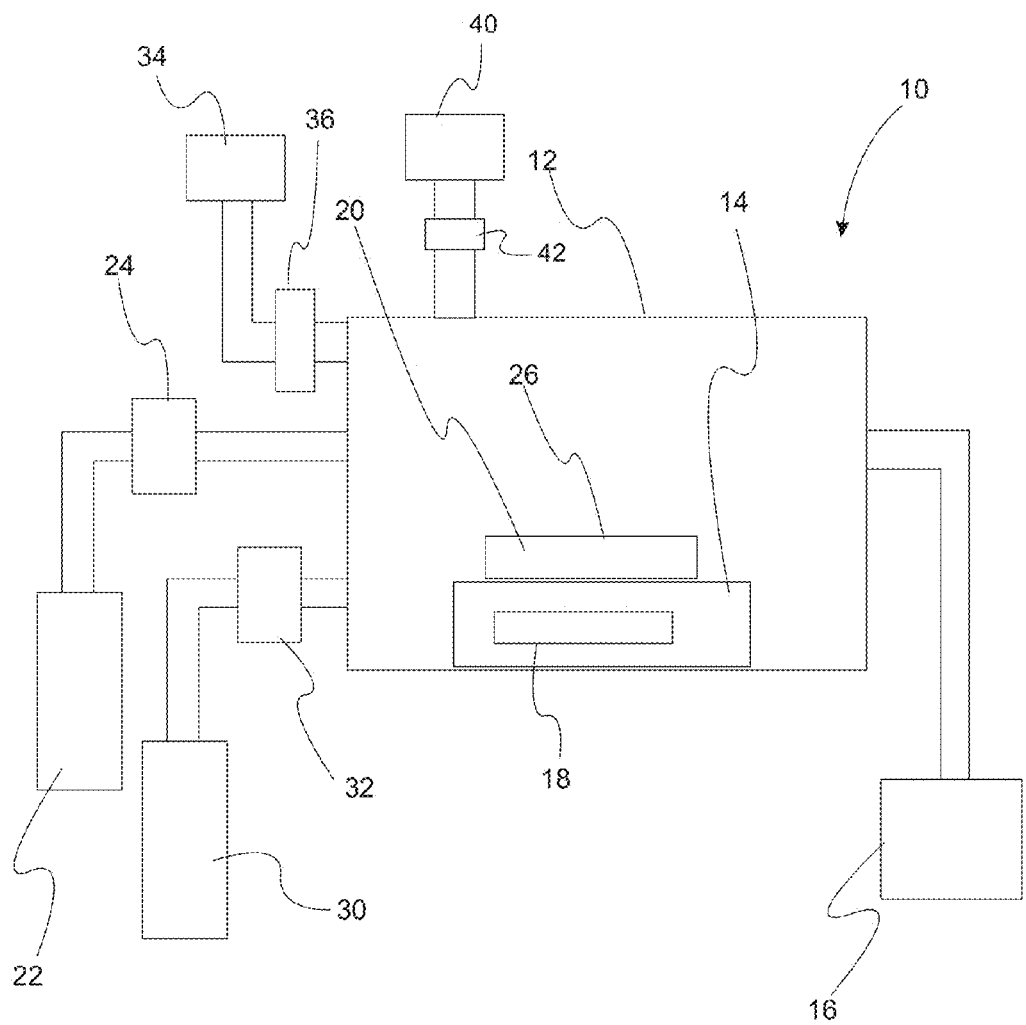
FIG. 1 is a schematic illustration of an ALD deposition system used in an embodiment of the present invention.

Reference will now be made in detail to presently preferred compositions, embodiments, and methods of the present invention which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: percent, "parts of," and ratio values are by weight; the description of a group or class of materials as suitable or preferred for a given purpose in connection with the invention implies that mixtures of any two or more of the members of the group or class are equally suitable or preferred; description of constituents in chemical terms refers to the constituents at the time of addition to any combination specified in the description, and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

Throughout this application, where publications are referenced, the disclosures of these publications in their entireties are hereby incorporated by reference into this application to more fully describe the state of the art to which this invention pertains.

ABBREVIATIONS

"RT" means "room temperature."
"s" means "seconds."
"THF" means "tetrahydrofuran."
"DME" means "1,2-dimethoxyethane."
"tmhd" means "tris(2,2,6,6-tetramethyl-3,5-heptanedionato)."
"dad$^{tBu2}$" means "1,4-di-tert-butyldiazadiene."
"XPS" means "X-ray photoelectron spectroscopy."
"SEM" means "scanning electron microscopy."
"XRD" means "X-ray diffraction."

In an embodiment, a method of reducing a compound having an atom in an oxidized state is provided. The method is particularly suited for forming metal-containing layers (e.g., metal layers) by ALD and by chemical vapor deposition. The method includes a step of reacting a first compound having an atom in an oxidized state with a reducing agent to form a second compound having the atom in a reduced state relative to the first compound. The atom in an oxidized state is selected from the group consisting of Groups 2 to 12 of the Periodic Table, As, Sb, Bi, Se, and Te. Characteristically, the reducing agent is selected from the group consisting of compounds described by formulae IA and IB:

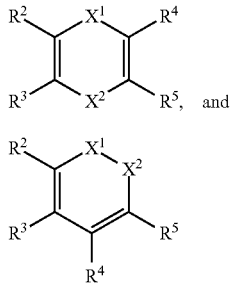

IA

IB wherein:
$X^1$ is $CR^6(SiR^1R^{1'}R^{1''})$ or $N(SiR^1R^{1'}R^{1''})$;
$X^2$ is $CR^7(SiR^1R^{1'}R^{1''})$ or $N(SiR^1R^{1'}R^{1''})$;
$R^1$, $R^{1'}$, $R^{1''}$, $R^2$, $R^3$, $R^4$, $R^5$, $R^6$, and $R^7$ are each independently H, $C_{1-10}$ alkyl, $C_{6-14}$ aryl, or $C_{4-14}$ heteroaryl.

In another embodiment, a method of forming a layer by an atomic layer deposition process is provided. The method includes a step of contacting a substrate with a vapor of a first compound having an atom in an oxidized state to form a first modified surface. The atom in an oxidized state is selected from the group consisting of Groups 2 to 12 of the Periodic Table, As, Sb, Bi, Se, and Te. The first modified surface is optionally contacted with an acid for a second predetermined pulse time to form a second modified surface. The first modified surface or the second modified surface is contacted with a reducing agent for a third predetermined pulse time to form the layer on the substrate. The reducing agent is selected from the group consisting of:

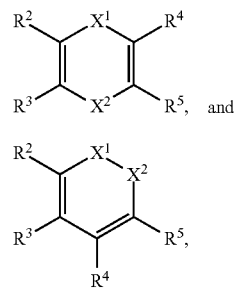

IA and

IB wherein:
$X^1$ is $CR^6(SiR^1R^{1'}R^{1''})$ or $N(SiR^1R^{1'}R^{1''})$;
$X^2$ is $CR^7(SiR^1R^{1'}R^{1''})$ or $N(SiR^1R^{1'}R^{1''})$;
$R^1$, $R^{1'}$, $R^{1''}$, $R^2$, $R^3$, $R^4$, $R^5$, $R^6$, and $R^7$ are each independently H, $C_{1-10}$ alkyl, $C_{6-14}$ aryl, or $C_{4-14}$ heteroaryl.

In a variation of compounds having formulae IA and IB, the reducing agent is selected from the group consisting of:

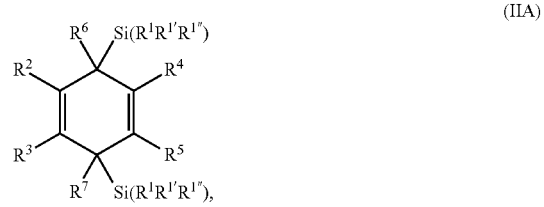

(IIA)

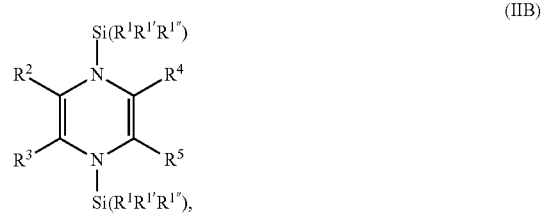

(IIB)

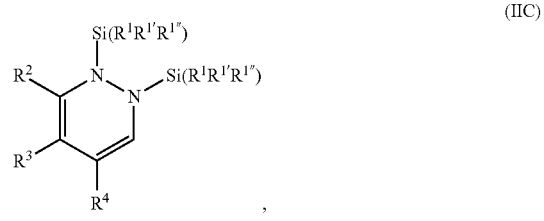

(IIC)

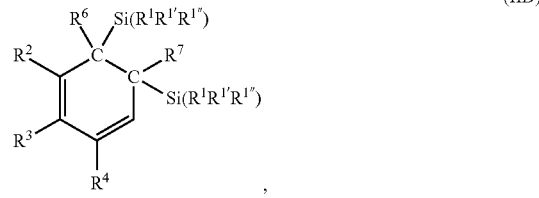

(IID)

and combinations thereof. The compound described by formula IIB is found to be particularly useful in forming metal-containing films.

Figure 2:
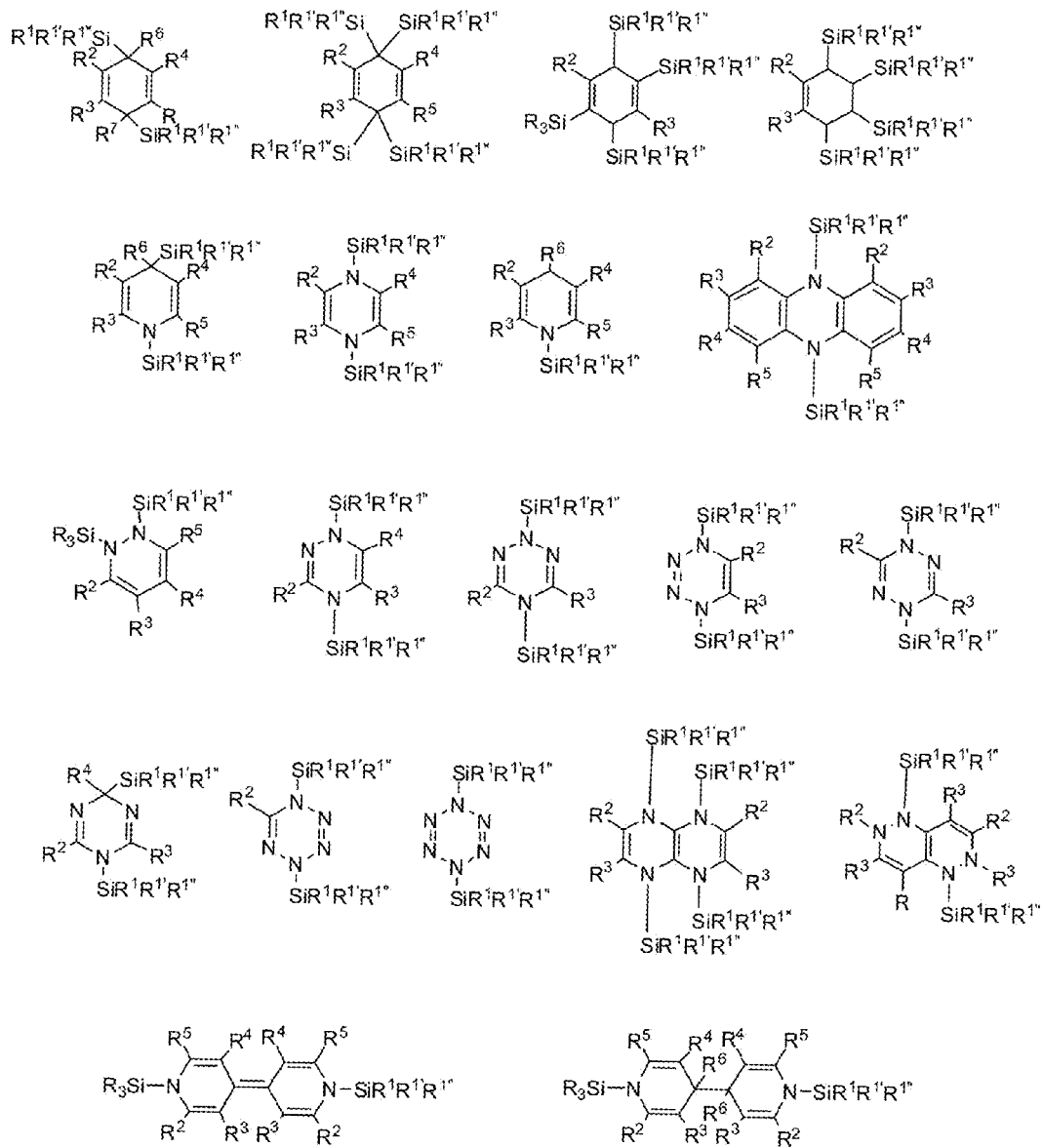
FIG. 2 is provides additional examples of reducing agents encompassed by the present invention.
Figure 3:
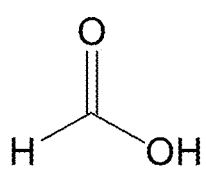
FIG. 3 provides examples of acids that can be reacted with the compounds of formula I.
Figure 3:
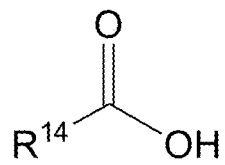
Figure 3:
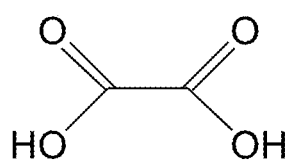
Figure 3:
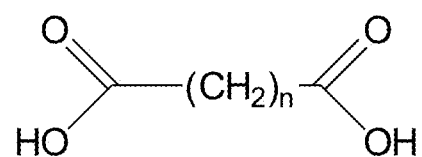
Figure 3:
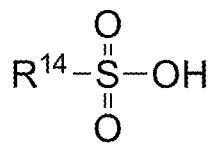
Figure 3:
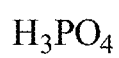
Figure 3:
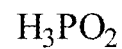

With reference to FIG. 2, additional examples of reducing agents are provided. In these examples, $R^1$, $R^{1'}$, $R^{1''}$, $R^2$, $R^3$, $R^4$, $R^5$, $R^6$, and $R^7$ are each independently H, $C_{1-10}$ alkyl, $C_{6-14}$ aryl, or $C_{4-14}$ heteroaryl.

In a refinement of the compounds described by formulae IA, IB, IIA, IIB, IIC, IID and the compounds of FIG. 2, $R^1$, $R^{1'}$, $R^{1''}$ are each independently $C_{1-10}$ alkyl; $R^2$, $R^3$, $R^4$, $R^5$ are each independently H or $C_{1-10}$ alkyl; and $R^6$, and $R^7$ are H. In another refinement, $R^1$, $R^{1'}$, $R^{1''}$ are each independently hydrogen, methyl, ethyl, n-propyl, isopropyl, n-butyl, sec-butyl, isobutyl, t-butyl, or phenyl. In still another refinement, $R^2$, $R^3$, $R^4$, and $R^5$ are each independently hydrogen, methyl, ethyl, n-propyl, isopropyl, n-butyl, sec-butyl, isobutyl, t-butyl, or phenyl. In yet another refinement, $R^6$, $R^7$ are each independently hydrogen, methyl, ethyl, n-propyl, isopropyl, n-butyl, sec-butyl, isobutyl, t-butyl, or phenyl. In a particularly useful example, $R^1$, $R^{1'}$, $R^{1''}$ are methyl; $R^6$, $R^7$ are hydrogen; and $R^2$, $R^3$, $R^4$, and $R^5$ are hydrogen or methyl. In another useful example, $R^1$, $R^{1'}$, $R^{1''}$ are methyl; $R^6$, $R^7$ are hydrogen; $R^2$, $R^3$, $R^4$, and $R^5$ are hydrogen or methyl.

As set forth above, the first compound includes an atom in an oxidized state selected from Groups 2 to 12 of the Periodic Table, As, Sb, Bi, Se, and Te. In particular, the atom in an oxidized state is in an oxidation state of +1, +2, +3, +4, +5, or +6. In a refinement, the atom in an oxidized state is a transition metal. Particularly useful examples of the atom in an oxidized state include, but are not limited to, Cu, Cr, Mn, Fe, Co, or Ni. Although the present invention is not limited by the type of the first compound that includes an atom in an oxidized state, compounds of the following structures are particularly useful:

wherein M is an atom selected from Groups 2 to 12 of the Periodic Table, As, Sb, Bi, Se, and Te; L is an anionic ligand; n is the number of anionic ligands; Y is a neutral ligand and m is the number of neutral ligands. Typically, n will be of sufficient number to neutralize any charge on M. In a refinement, n is from 1 to 6 and m is from 1 to 5. Examples for L include optionally substituted cyclopentadienyl, optionally substituted β-diketonates, optionally substituted amidinates, optionally substituted guanidinates, optionally substituted β-aminoalkoxides, optionally substituted allyls, and optionally substituted tris(pyrazolyl)borates.

In another refinement of the present embodiment, a method for forming a metal is provided. In this context, the metal is characterized in having metal atoms in the zero oxidation state. The present refinement can be carried out either in solution or in the vapor phase (e.g. ALD, chemical vapor deposition, etc) at temperatures from about 50 to 400° C. In another refinement, the metal deposition is carried out at temperatures from about 75 to 200° C.

In a further refinement, a method of forming a metal film by an atomic layer deposition process is provided. The method comprises a deposition cycle which includes contacting the substrate with vapor of a first compound having an atom in an oxidized state as set forth above such that at least a portion of the vapor of the first compound adsorbs or reacts with a substrate surface to form a modified surface. The deposition cycle further includes contacting the modified surface with a vapor of the reducing agents set forth above to react and form at least a portion of the metal film. Typically, the first compound having an atom in an oxidized state is contacted with the reducing agent at a temperature from about 50 to 400° C. The present reaction is used in an ALD process as set forth below.

With reference to FIG. 1, deposition system 10 includes reaction chamber 12, substrate holder 14, and vacuum pump 16. Typically, the substrate is heated via heater 18. The method has a deposition cycle comprising contacting substrate 20 with a vapor of the first compound having an atom in an oxidized state as set forth above. In particular, the vapor is introduced from precursor source 22 into reaction chamber 12 for a predetermined pulse time. The pulse time is controlled via control valve 24. At least a portion of the vapor of the first compound modifies (e.g. adsorbs or reacts with) substrate surface 26 to form a modified surface. The method further comprises contacting the modified surface with a vapor of the reducing agent as set forth above from source 30 for a predetermined pulse time.

In a variation of the present embodiment, the method further comprises removing at least a portion of the vapor of the first compound that is lingering in the gas phase (i.e., has not adsorbed or reacted with the substrate) from the vicinity of the substrate before introducing the vapor of the reducing agent and removing at least a portion of the vapor of the reducing agent from the vicinity of the substrate. The metal-containing compound and the reducing agent are removed in purging steps by introducing a purge gas from purge source 34 into reaction chamber 12 for a predetermined purge time. The purge time is controlled by control valve 36.

In another variation, the method further includes at least one additional deposition cycle comprising sequentially contacting the substrate with the vapor of the first compound and then the vapor of the reducing agent. In some refinements, the substrate is contacted for a plurality of additional deposition cycles. For example, the substrate may be contacted with from 1 to several thousand deposition cycles depending on the thickness of the film desired. In particular, the substrate is contacted with the vapor of the first compound having an atom in an oxidized state and then the vapor of the reducing agent for 1 to 5000 deposition cycles. In another refinement, the substrate is contacted with the vapor of the first compound having an atom in an oxidized state and then the vapor of the reducing agent for 10 to 2000 deposition cycles. In still another refinement, the substrate is contacted with the vapor of the first compound having an atom in an oxidized state and then the vapor of the reducing agent for 20 to 1000 deposition cycles.

In another embodiment, a method of forming a metal-containing film is provided. With reference to FIG. 1, the vapor of the first compound having an atom in an oxidized state is introduced from precursor source 22 into reaction chamber 12 for a first predetermined pulse time. The first predetermined pulse time should be sufficiently long that available binding sites on the substrate surface (coated with metal layers or uncoated) are saturated (i.e., metal-containing compound attached). Typically, the first predetermined pulse time is from 1 second to 20 seconds. The first predetermined pulse time is controlled via control valve 24. At least a portion of the vapor of the metal-containing compound modifies (e.g, adsorbs or reacts with) substrate surface 26 to form a first modified surface. Reaction chamber 12 is then purged with an inert gas for a first purge time. The first purge time is sufficient to remove the metal-containing compound from reaction chamber 12 and is typically from 0.5 seconds to 2 minutes.

Figure 4:
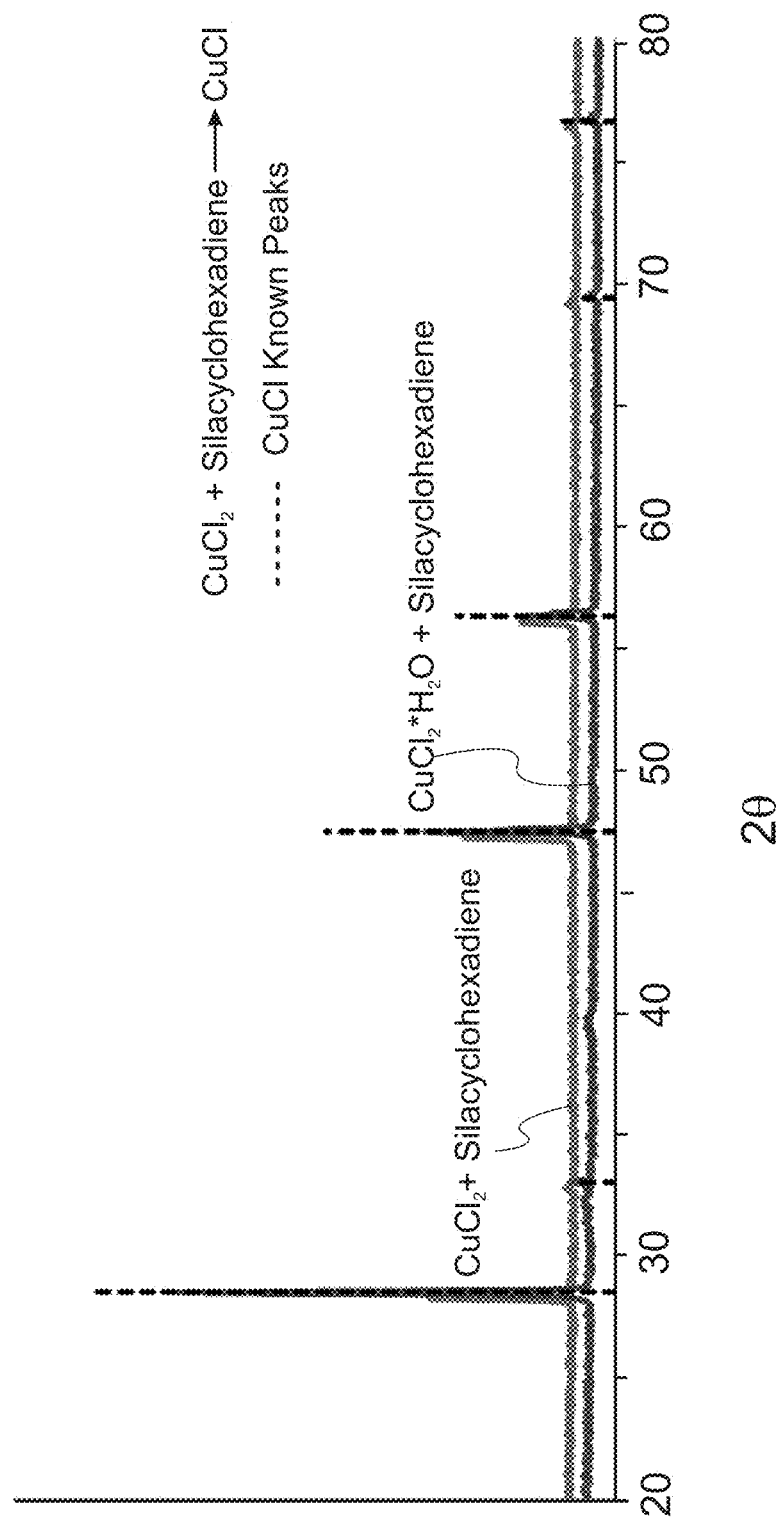
FIG. 4 provides X-ray diffraction spectrum showing CuCl formed by the solution reduction of $CuCl_2$ by 1,4-bis(trimethylsilyl)-1,4-cyclohexadiene.

In the next reaction step of the deposition cycle, an acid such as formic acid is then introduced from acid source 40 into reaction chamber 12 for a second predetermined pulse time. Examples of other suitable acids are provided in FIG. 4. In FIG. 4, $R^{14}$ is H (i.e., hydride), $C_{1-8}$ alkyl, $C_{6-12}$ aryl, or $C_{1-8}$ fluoroalkyl, X is $N_3^-$, $NO_3^-$, halide (e.g., Cl, F, Br), and n is an integer from 1 to 6. In a refinement, $R^4$ is hydride, $C_{1-4}$ alkyl, $C_{6-10}$ aryl, or $C_{1-4}$ fluoroalkyl, X is $N_3^-$, $NO_3^-$, halide (e.g., Cl, F, Br), and n is an integer from 1 to 6. Examples of useful alkyl groups include, but are not limited to, methyl, ethyl, n-propyl, isopropyl, n-butyl, t-butyl, isobutyl, sec-butyl, and the like. Examples of useful aryl groups include, but are not limited to, phenyl, tolyl, naphthyl, and the like. The second predetermined pulse time is controlled via valve 42 and should be sufficiently long that available binding sites on the first modified substrate surface are saturated and a second modified surface is formed. Typically, the second predetermined pulse time is from 0.1 second to 20 seconds. The second predetermined pulse time is controlled via control valve 32. Reaction chamber 12 is then purged with an inert gas for a second purge time (typically, 0.5 seconds to 2 minutes as set forth above).

In the final reaction step of the deposition cycle, a reducing agent as set forth above is then introduced from activating agent source 30 into reaction chamber 12 for a third predetermined time. The third predetermined pulse time should be sufficiently long that available binding sites on the second modified substrate surface are saturated with a metal layer being formed thereon. Typically, the third predetermined pulse time is from 0.1 second to 20 seconds. Reaction chamber 12 is then purged with an inert gas for a third purge time (typically, 0.5 seconds to 2 minutes as set forth above).

During film formation by the method of the present embodiment, the substrate will be at a temperature suitable to the properties of the chemical precursor(s) and film to be formed. In a refinement of the method, the substrate is set to a temperature from about 0 to 1000° C. In another refinement of the method, the substrate has a temperature from about 50 to 450° C. In another refinement of the method, the substrate has a temperature from about 100 to 250° C. In still another refinement of the method, the substrate has a temperature from about 150 to 400° C. In another refinement of the method, the substrate has a temperature from about 200 to 300° C.

Similarly, the pressure during film formation is set at a value suitable to the properties of the chemical precursors and film to be formed. In one refinement, the pressure is from about $10^{-6}$ Torr to about 760 Torr. In another refinement, the pressure is from about 0.1 millitorr to about 10 Torr. In still another refinement, the pressure is from about 1 to about 100 millitorr. In yet another refinement, the pressure is from about 1 to 20 millitorr.

Pulse times and purge times also depend on the properties of the chemical precursors and the geometric shape of the substrates. Thin film growth on flat substrates uses short pulse and purge times, but pulse and purge times in ALD growth on 3-dimensional substrates can be very long. Therefore, in one refinement, pulse times and purge times are each independently from about 0.0001 to 200 seconds. In another refinement, pulse and purge times are each independently from about 0.1 to about 10 seconds.

The following examples illustrate the various embodiments of the present invention. Those skilled in the art will recognize many variations that are within the spirit of the present invention and scope of the claims.

Experimental Section

Silacyclohexadiene

Scheme 1 illustrates the synthesis of silacyclohexadiene according to a literature procedure [1]. The air-sensitive product was a clear liquid, and was relatively pure by $^1$H NMR.

Scheme 1

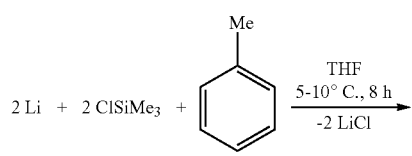

-continued

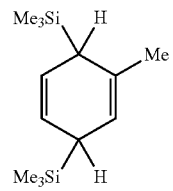

Figure 5:
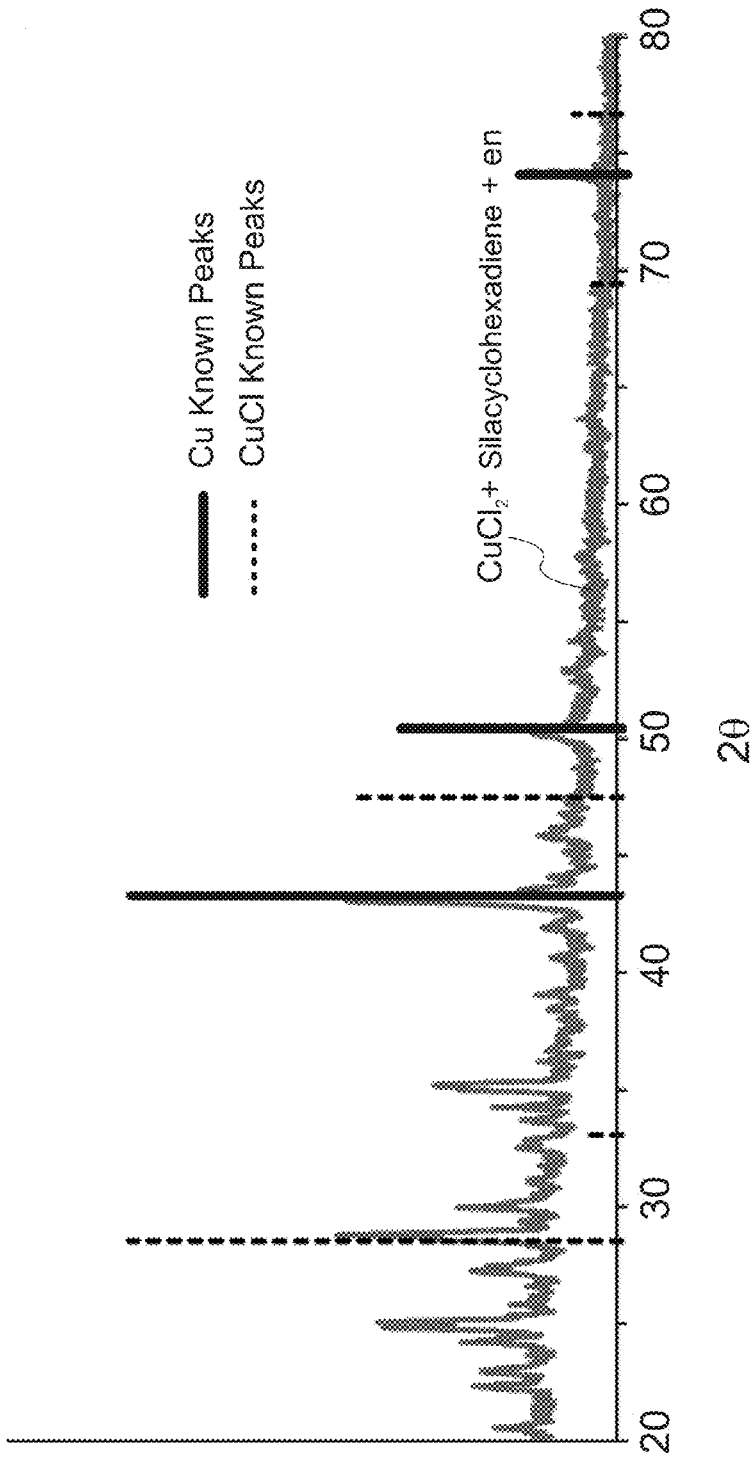
FIG. 5 provides X-ray diffraction spectrum showing copper metal formed by the solution reduction of $CuCl_2$ to CuCl by 1,4-bis(trimethylsilyl)-1,4-cyclohexadiene, and the subsequent disproportionation to copper metal by ethylenediamine.

Solution reductions were attempted with a variety of metal salts, using five molar equivalents of silacyclohexadiene (Table 1). Analysis by X-ray diffractometry (XRD) confirmed that $CuCl_2$ and $CuBr_2$ were reduced to CuCl and CuBr, respectively, (FIGS. 4 and 5). However, silacyclohexadiene lacked the reducing power to reduce any of the salts to elemental metal. Addition of ethylenediamine to the $CuCl_2$.DME adduct resulted in a disproportionation reaction and precipitation of copper metal.

TABLE 1

Solution reduction reactions of various metal salts with silacyclohexadiene.

| $ML_2$ | Sol | Vol | Reaction Temp | Reaction Time (min) | Reflux Temp | Reflux Time (min) | Reaction solution → Precipitate |
|---|---|---|---|---|---|---|---|
| $CuCl_2 \cdot H_2O$ | THF | 15 ml | RT | 60 | — | — | milky white → CuCl (insoluble) |
| $CuCl_2 \cdot H_2O$ | THF | 50 ml | 0° C. | 5 | 65° C. | 65 | milky white → CuCl (insoluble) |
| $CuCl_2 \cdot DME$ | DME | 45 ml | RT | 20 | 95° C. | 75 | milky white → add en → Cu metal |
| $CuBr_2$ | THF | 30 ml | RT | 60 | — | — | milky white → CuBr (probably) |
| $Cu(dmap)_2$ | THF | 15 ml | RT | 80 | 65° C. | 60 | dark orange → none |
| $Cu(hfac)_2$ | THF | 50 ml | RT | 35 | 65° C. | 60 | light green → none |
| $Cu(tmhd)_2$ | THF | 50 ml | RT | 60 | 65° C. | 60 | light blue → none |
| $Cu(HCOO)_2$ | THF | 50 ml | 0° C. | 5 | 65° C. | 60 | aqua green → none |
| $CoCl_2$ | THF | 50 ml | RT | 60 | 65° C. | 60 | light blue → none |
| $ZnCl_2$ | THF | 50 ml | RT | 105 | 65° C. | 60 | clear → none |

Copper metal film growth was attempted by ALD using bis(dimethylaminopropanoxide)copper [$Cu(dmap)_2$] and silacyclohexadiene as reagents. Various substrates were tested for film growth, including Si(100), SiH, thermal $SiO_2$, Cu, Pt, Pd, TiN, and $Ru/SiO_2$. Each cycle consisted of a 3.0 s pulse of $Cu(dmap)_2$, a 10.0 s purge, a 1.0 s pulse of silacyclohexadiene, and a final 10.0 s purge. The silacyclohexadiene bubbler was maintained at 70° C. and the reaction chamber was held at 150° C. After 1,000 cycles, a copper film was clearly observable on the ruthenium substrate. A growth rate of 0.08 Å/cycle was determined after measurement of the film by scanning electron microscopy (SEM). Copper metal was not observed on any other substrates.

Scheme 2 provides a reaction scheme for a two-step ALD process using Cu(dmap)$_2$ and silacyclohexadiene:

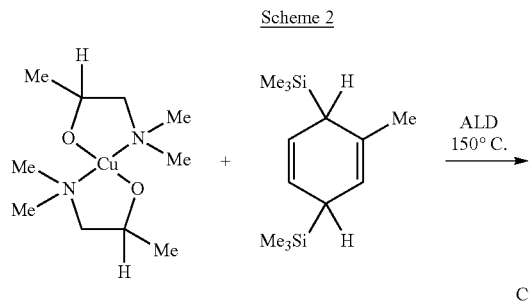

Scheme 2

Figure 6:
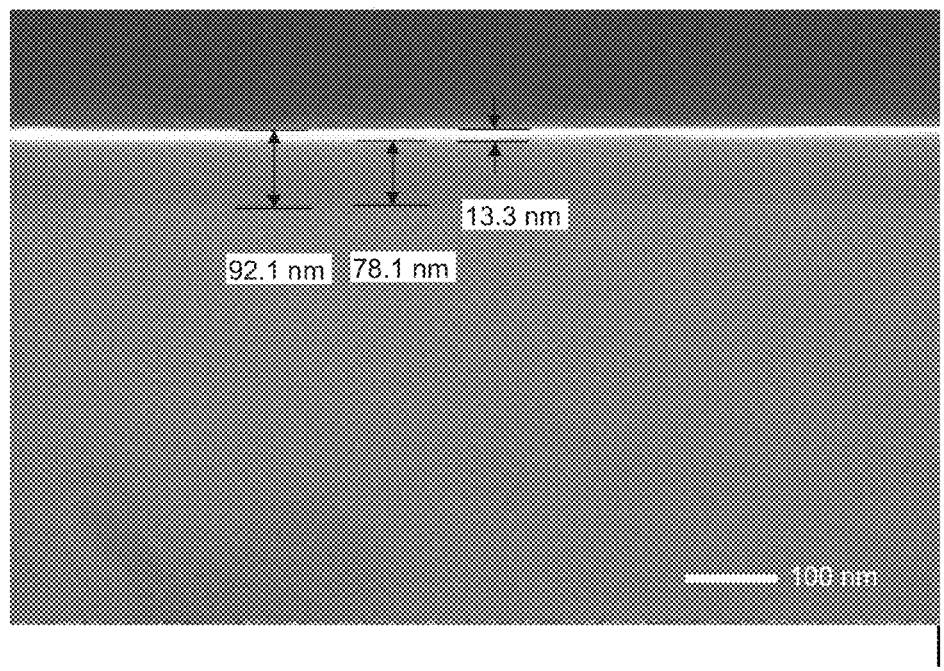
FIG. 6 provides a scanning electron micrograph of a copper film (~8 nm) on a ruthenium-coated (5 nm) $SiO_2$ wafer.

FIG. 6 provides a scanning electron micrograph of copper film (~8 nm) on a ruthenium-coated (5 nm) SiO$_2$ wafer.

Computational Screening

Modifications to the ring substituents were explored computationally as a possible means of increasing reactivity. Using Gaussian 09, numerous bis(silyl)hexadiene structures were optimized with the 6-311+G(d,p) basis set at the B3LYP level in the gas phase. The total electronic energy of the silylated structure was subtracted from that of the aromatic structure. The energy difference of each molecular variant was expressed relative to the toluene analogue, which was normalized to zero. This model considers only the relative change in the electronic energy of the reducing agent upon aromatization, irrespective of the ligand system being used. Reaction kinetics and changes in system entropy were not taken into account. To reduce the computational effort, the trimethylsilyl groups were approximated by SiH$_3$ groups. Scheme 3 provides a partial reaction showing the desilylation of the non-conjugated cyclohexadiene backbone resulting in the formation of an aromatic product:

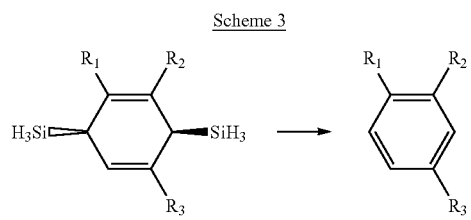

Scheme 3

Table 2 shows representative combinations of ring substituents, along with the relative electronic energy differences. The structure with three methoxy groups shows the greatest improvement, with −3.636 kcal per mole upon aromatization relative to the toluene analogue. These data do not indicate significant improvements to the initial silacyclohexadiene structure, and thus, were not explored experimentally.

TABLE 2

Representative values of the relative electronic energy difference upon aromatization with respect to 2-methyl-1,4-bis(trimethylsily)-1,4-cyclohexadiene (toluene analogue).

| R$_1$ | R$_2$ | R$_3$ | ΔE$_{rel}$ [kcal/mol] | R$_1$ | R$_2$ | R$_3$ | ΔE$_{rel}$ [kcal/mol] |
|---|---|---|---|---|---|---|---|
| H | H | H | −0.031 | OCH$_3$ | H | OCH$_3$ | 2.070 |
| CH$_3$ | H | H | — | H | OCH$_3$ | OCH$_3$ | 0.389 |
| CH$_3$ | CH$_3$ | H | −3.038 | OCH$_3$ | OCH$_3$ | OCH$_3$ | −3.636 |
| CH$_3$ | H | CH$_3$ | −0.036 | Si(CH$_3$)$_3$ | H | H | −1.824 |
| H | CH$_3$ | CH$_3$ | 0.089 | CH$_3$ | NO$_2$ | H | 0.390 |
| CH$_3$ | CH$_3$ | CH$_3$ | −3.147 | CH$_3$ | H | NO$_2$ | 0.520 |
| NO$_2$ | H | H | 1.346 | H | CH$_3$ | NO$_2$ | 1.124 |
| NO$_2$ | NO$_2$ | H | 0.585 | CH$_3$ | CH$_3$ | NO$_2$ | −2.737 |
| NO$_2$ | H | NO$_2$ | 4.162 | CH$_3$ | NO$_2$ | CH$_3$ | 0.256 |
| H | NO$_2$ | NO$_2$ | 4.982 | NO$_2$ | CH$_3$ | CH$_3$ | −1.648 |
| NO$_2$ | NO$_2$ | NO$_2$ | 3.618 | NO$_2$ | NO$_2$ | CH$_3$ | 0.190 |
| OCH$_3$ | H | H | 2.560 | NO$_2$ | CH$_3$ | NO$_2$ | 2.487 |
| OCH$_3$ | OCH$_3$ | H | −2.610 | CH$_3$ | NO$_2$ | NO$_2$ | 3.118 |

Subsequently, attention focused on modifying the ring system itself. It is postulated that an 8 π electron anti-aromatic structure would have a greater driving force toward aromatization than would any 4 π electron non-conjugated system. The 1,4-bis(trimethylsilyl)-1,4-dihydropyrazine molecule was previously crystallized as a planar structure [2] possessing anti-aromatic character and a very low first vertical ionization energy of 6.16 (eV) [3].

1,4-bis(trimethylsilyl)-1,4-dihydropyrazine 1,4-bis(trimethylsilyl)-1,4-dihydropyrazine was prepared on a 40 g scale following a literature procedure [4]. The air-sensitive, yellow solid was purified by sublimation at 80° C./0.05 Torr. Preparative sublimation on the product yielded 97.1% recovery with no residue. The thermal decomposition temperature was determined to be greater than 254° C.

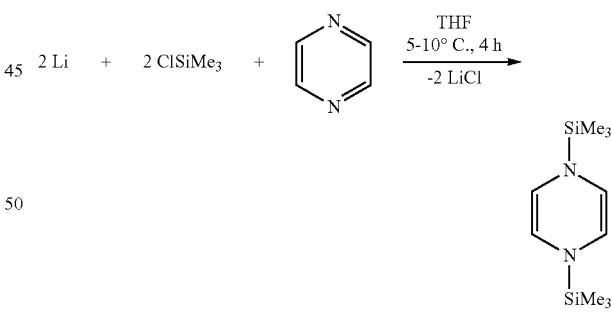

Figure 7:
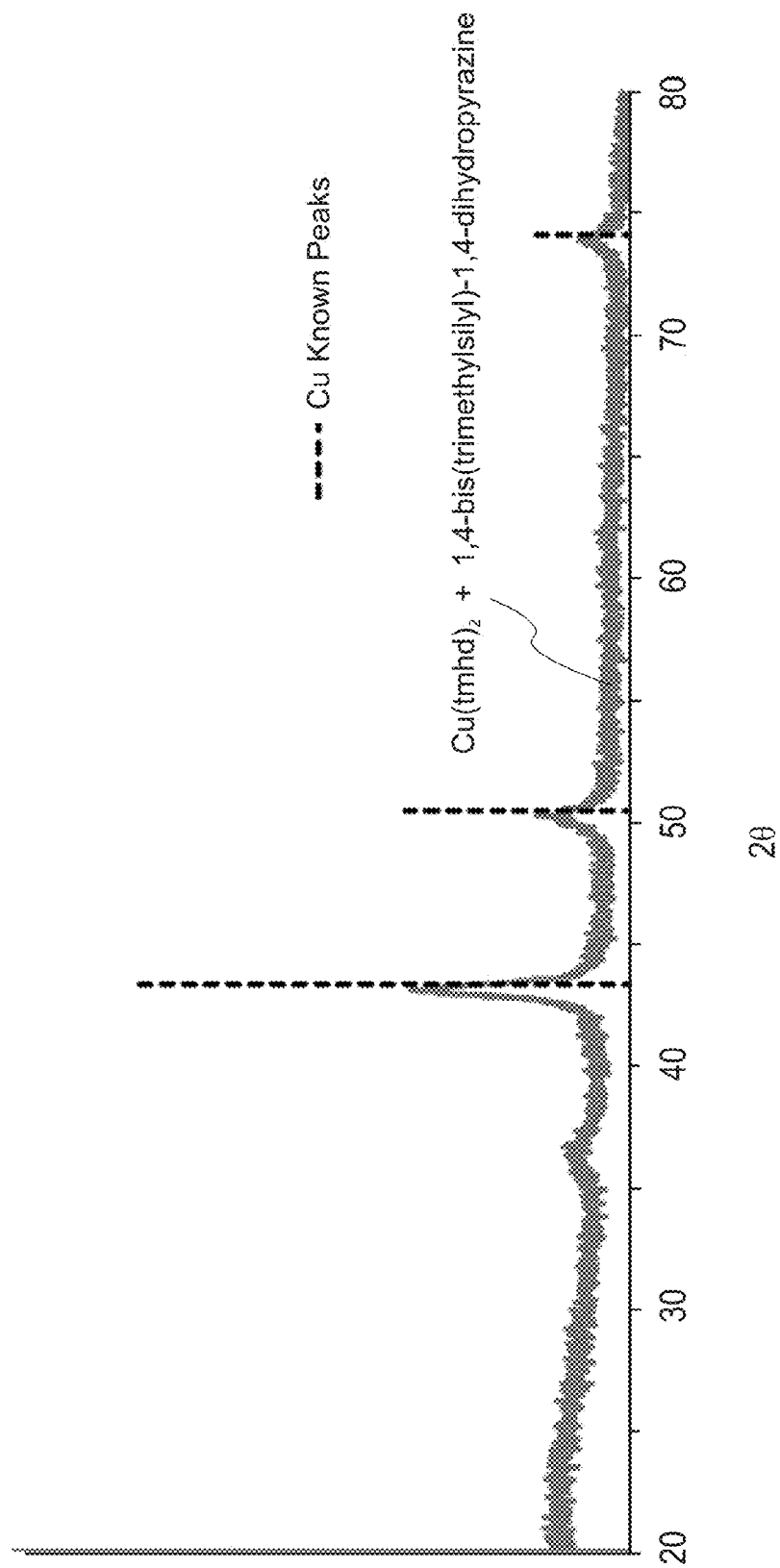
FIG. 7 provides X-ray diffraction spectrum showing copper metal formed by the solution reduction of $Cu(tmhd)_2$ by 1,4-bis(trimethylsilyl)-1,4-dihydropyrazine.
Figure 8:
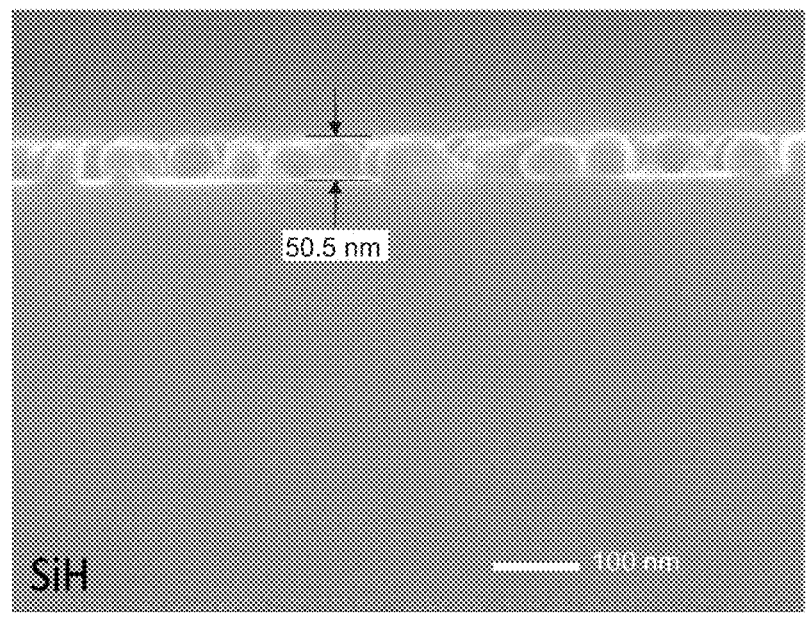
FIG. 8 provides a cross-sectional SEM micrograph of a copper film on a SiH substrate formed from $Cu(dmap)_2$.
Figure 9:
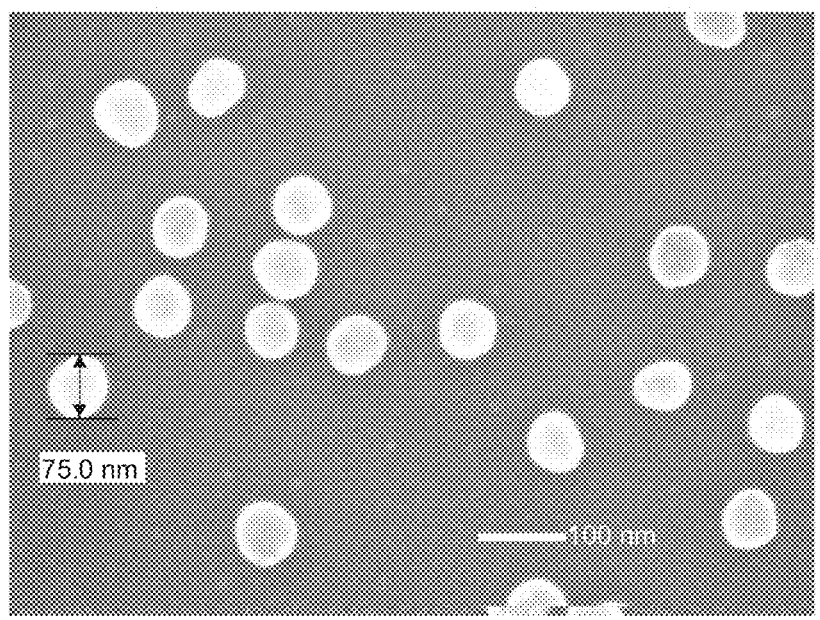
FIG. 9 provides a top-down SEM micrograph of a copper film on $Co/SiO_2$ formed from $Cu(dmap)_2$.
Figure 10:
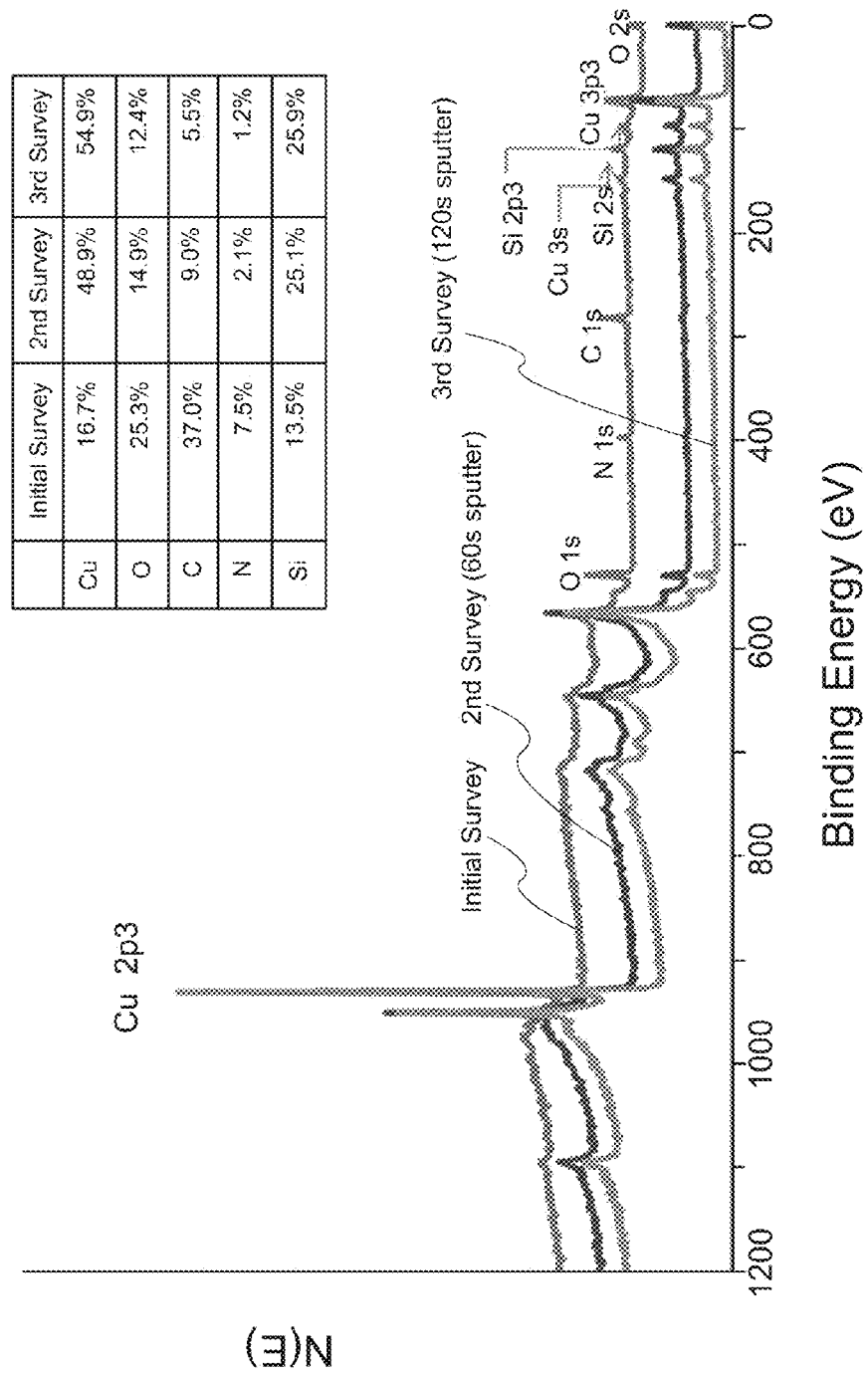
FIG. 10 provides XPS plots of a 51 nm copper film deposited on SiH at 150° C. formed from $Cu(dmap)_2$.
Figure 11:
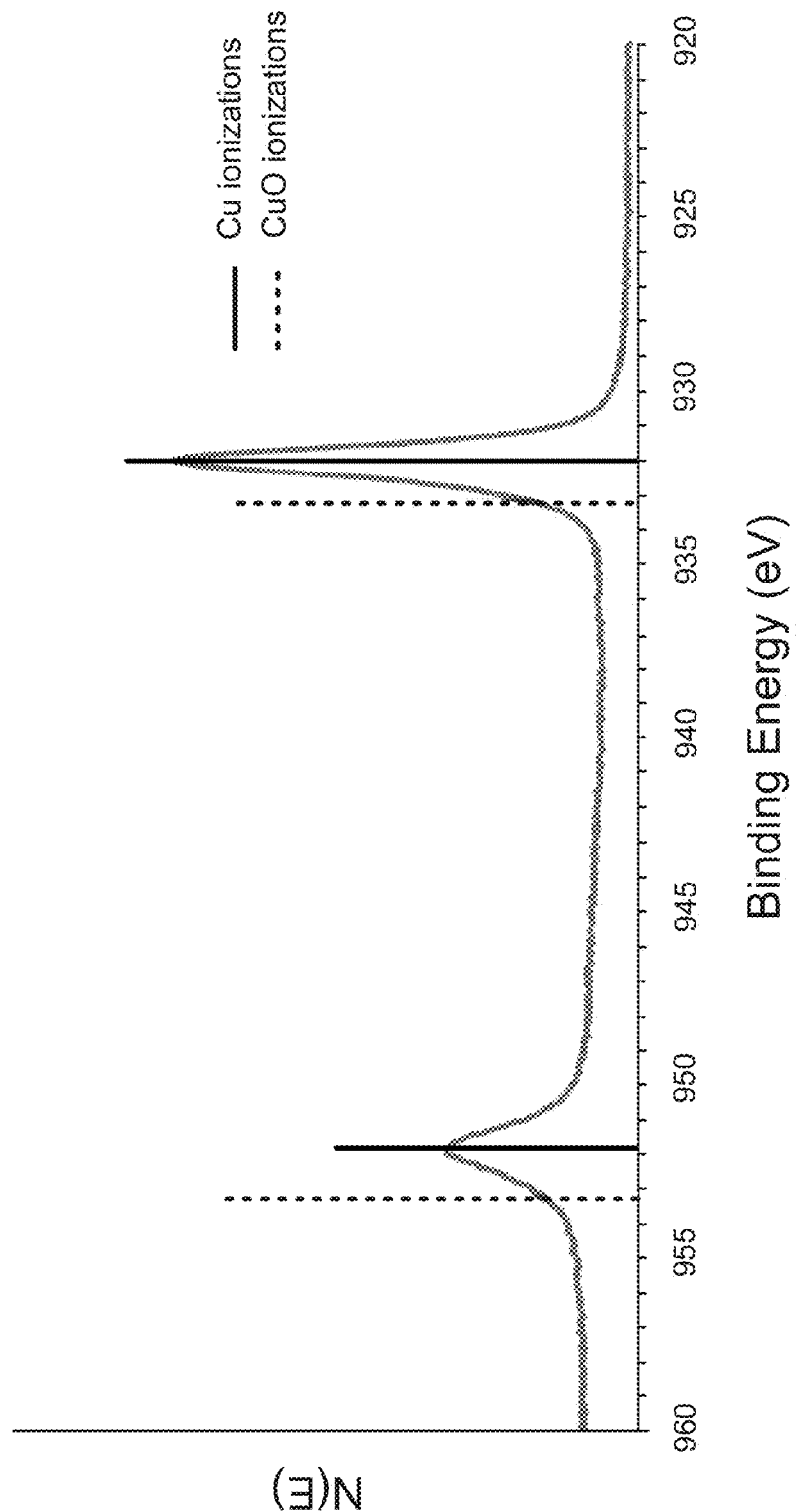
FIG. 11 provides an XPS high-resolution multiplex of the Cu 2p3 region of a film formed from $Cu(dmap)_2$.
Figure 12:
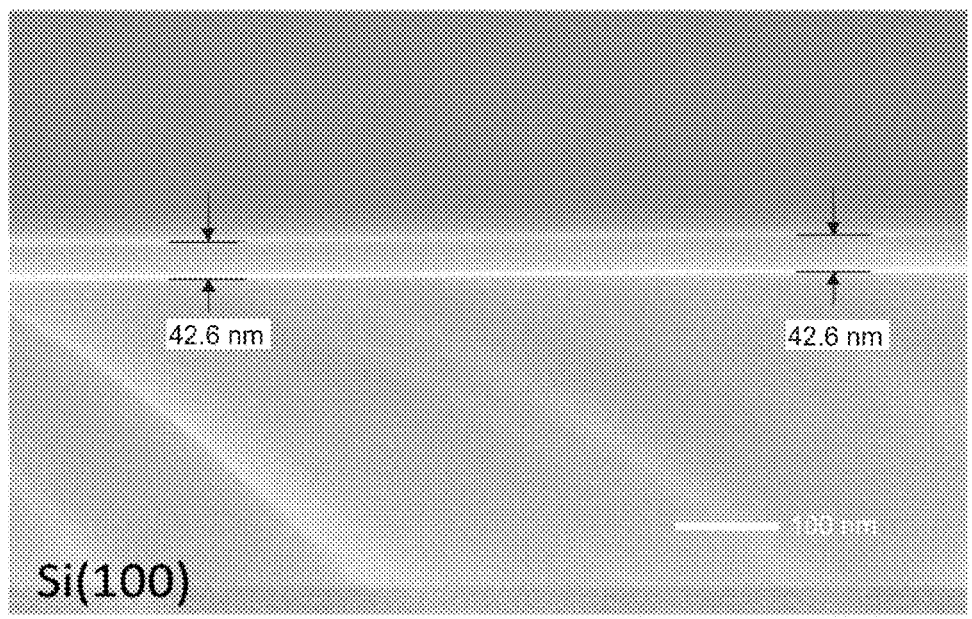
FIG. 12 provides a cross-sectional SEM micrograph of a nickel film on a Si(100) substrate formed from $Ni(dmap)_2$.
Figure 13:
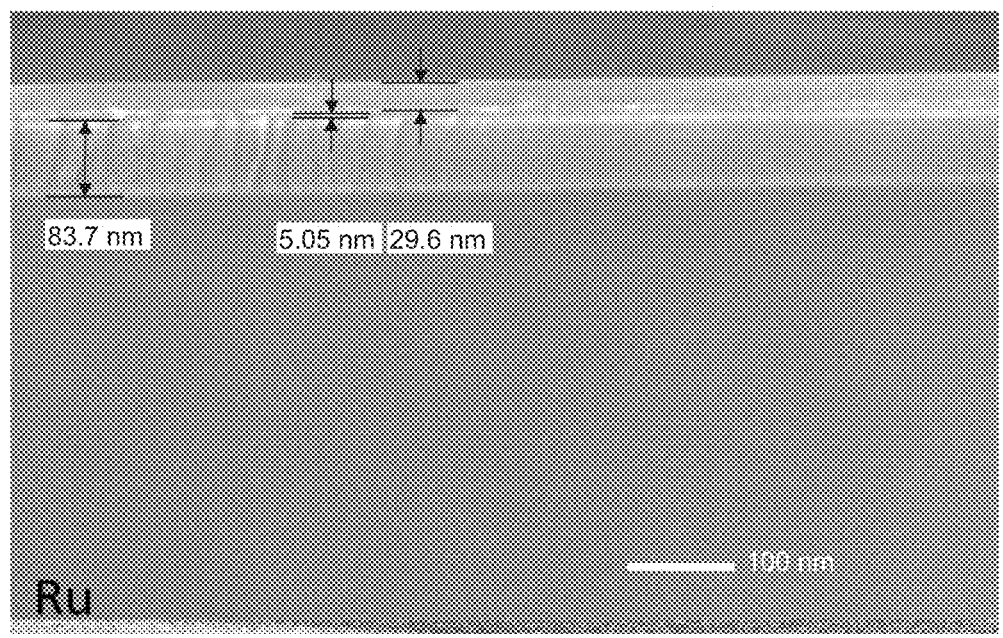
FIG. 13 provides a cross-sectional SEM micrograph of a nickel film on a $Ru/SiO_2$ substrate formed from $Ni(dmap)_2$.
Figure 14:
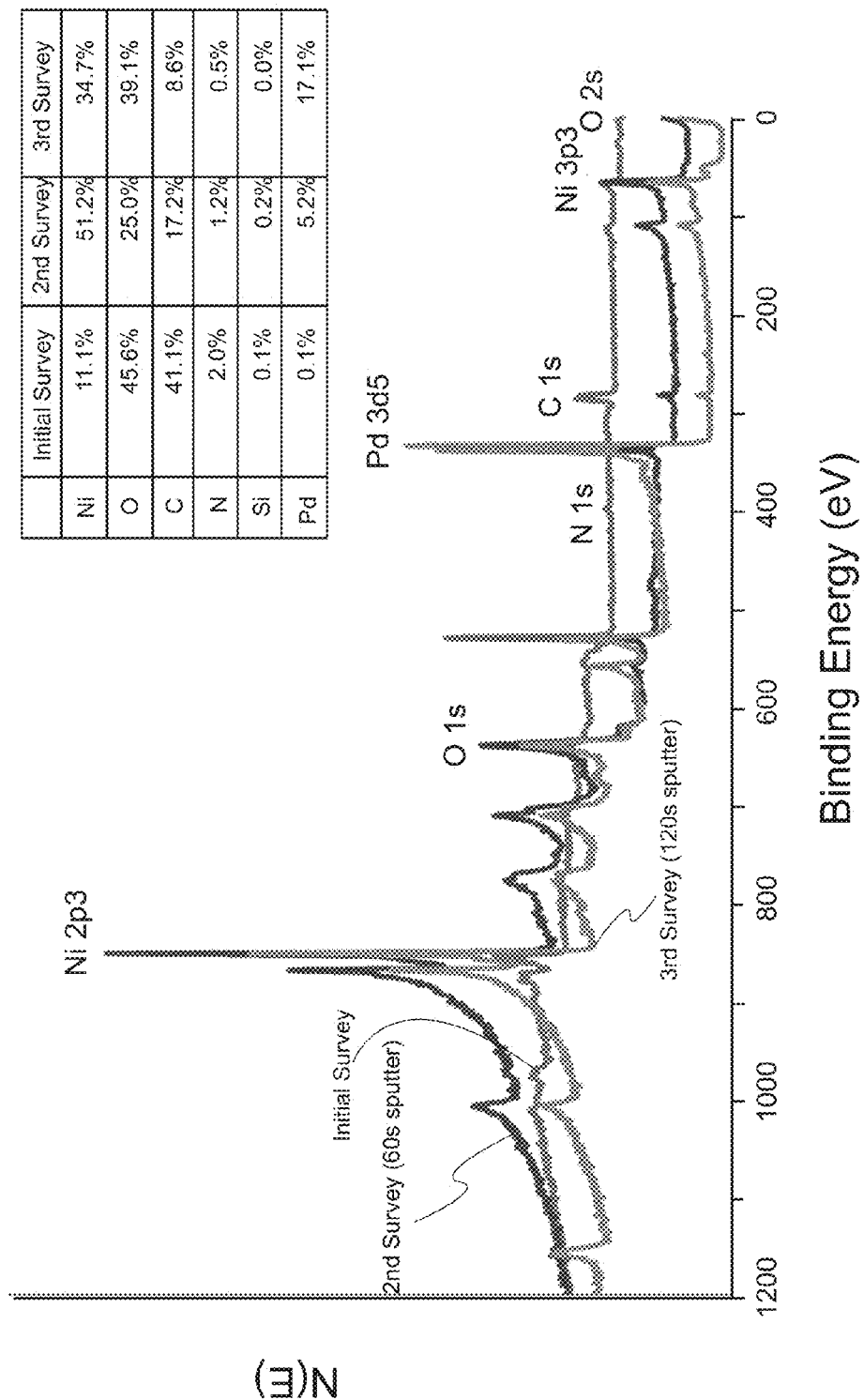
FIG. 14 provides an XPS plot of a 32 nm nickel film deposited on Pd at 150° C. formed from $Ni(dmap)_2$.
Figure 15:
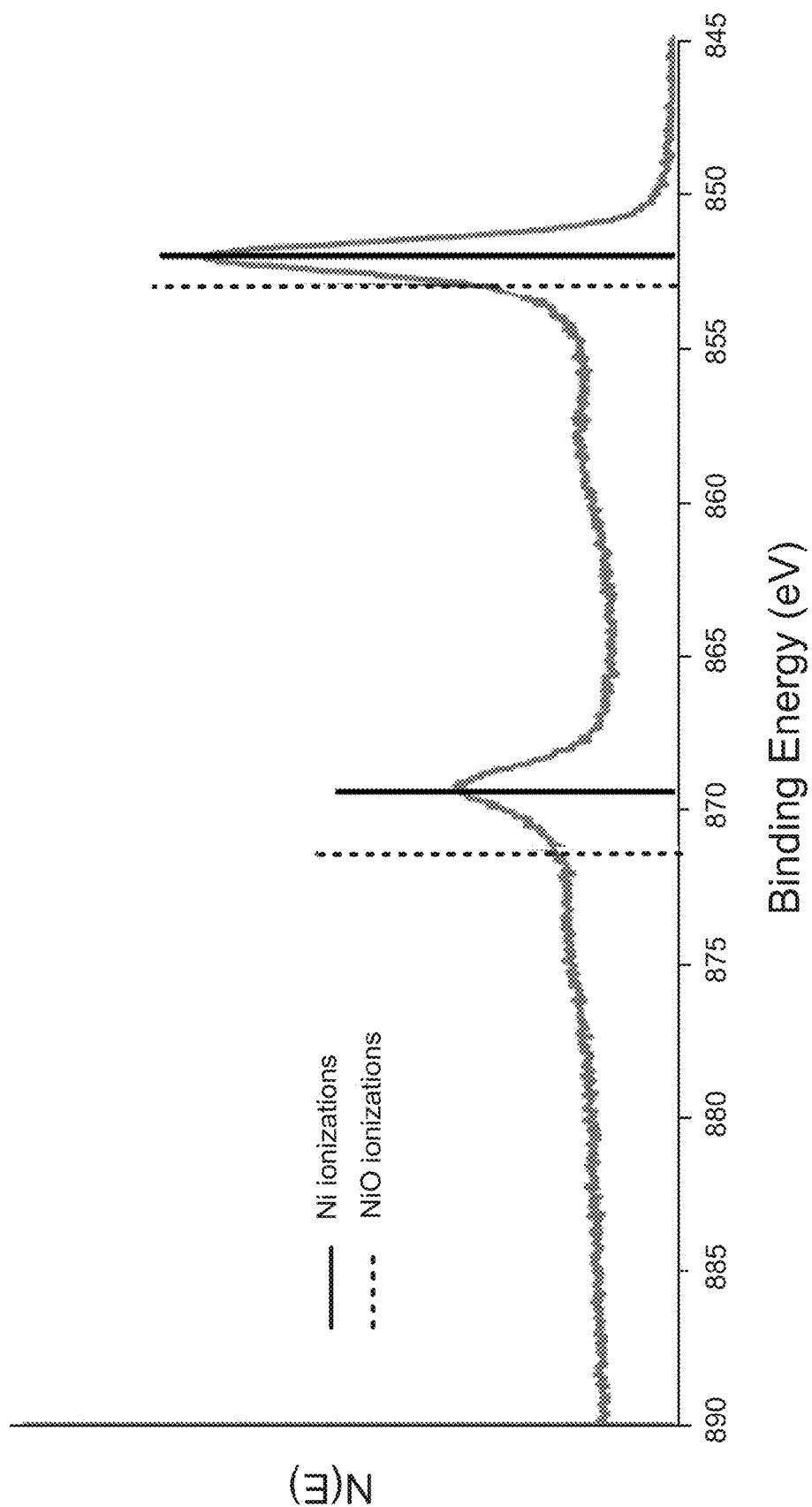
FIG. 15 provides an XPS high-resolution multiplex of the Ni 2p3 region of a film formed from $Ni(dmap)_2$.
Figure 16:
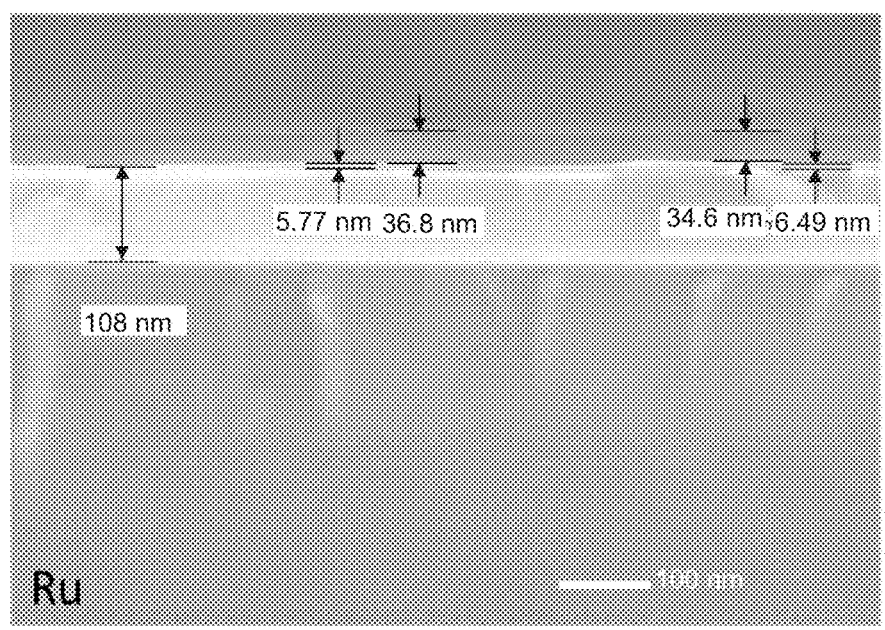
FIG. 16 provides a cross-sectional SEM micrograph of a chromium film on a $Ru/SiO_2$ substrate formed from $Cr(dad^{tBu2})_2$.
Figure 17:
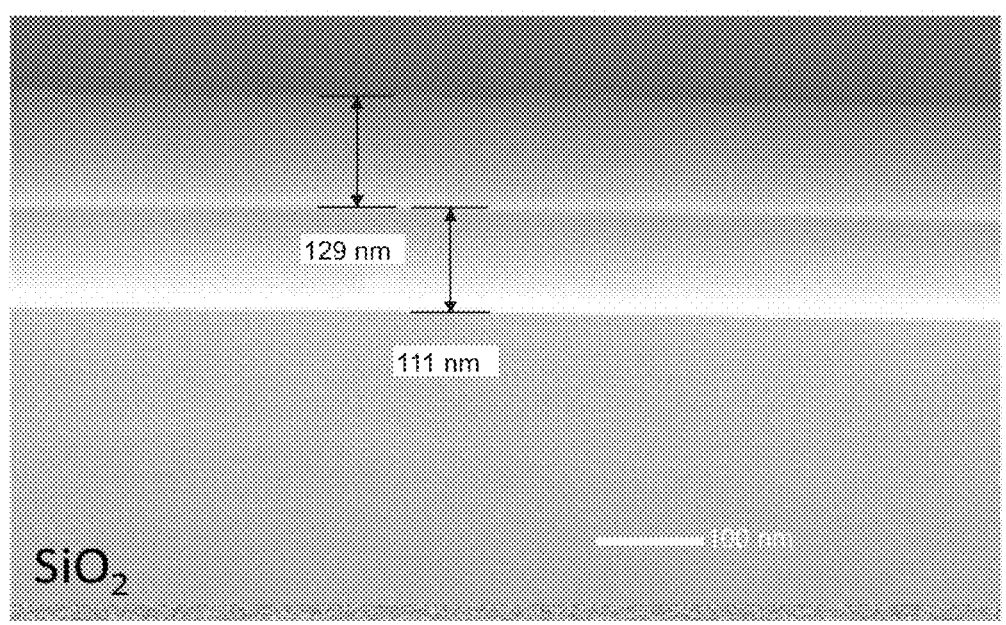
FIG. 17 provides a cross-sectional SEM micrograph of chromium film on $SiO_2$ substrate formed from $Cr(dad^{tBu2})_2$.
Figure 18:
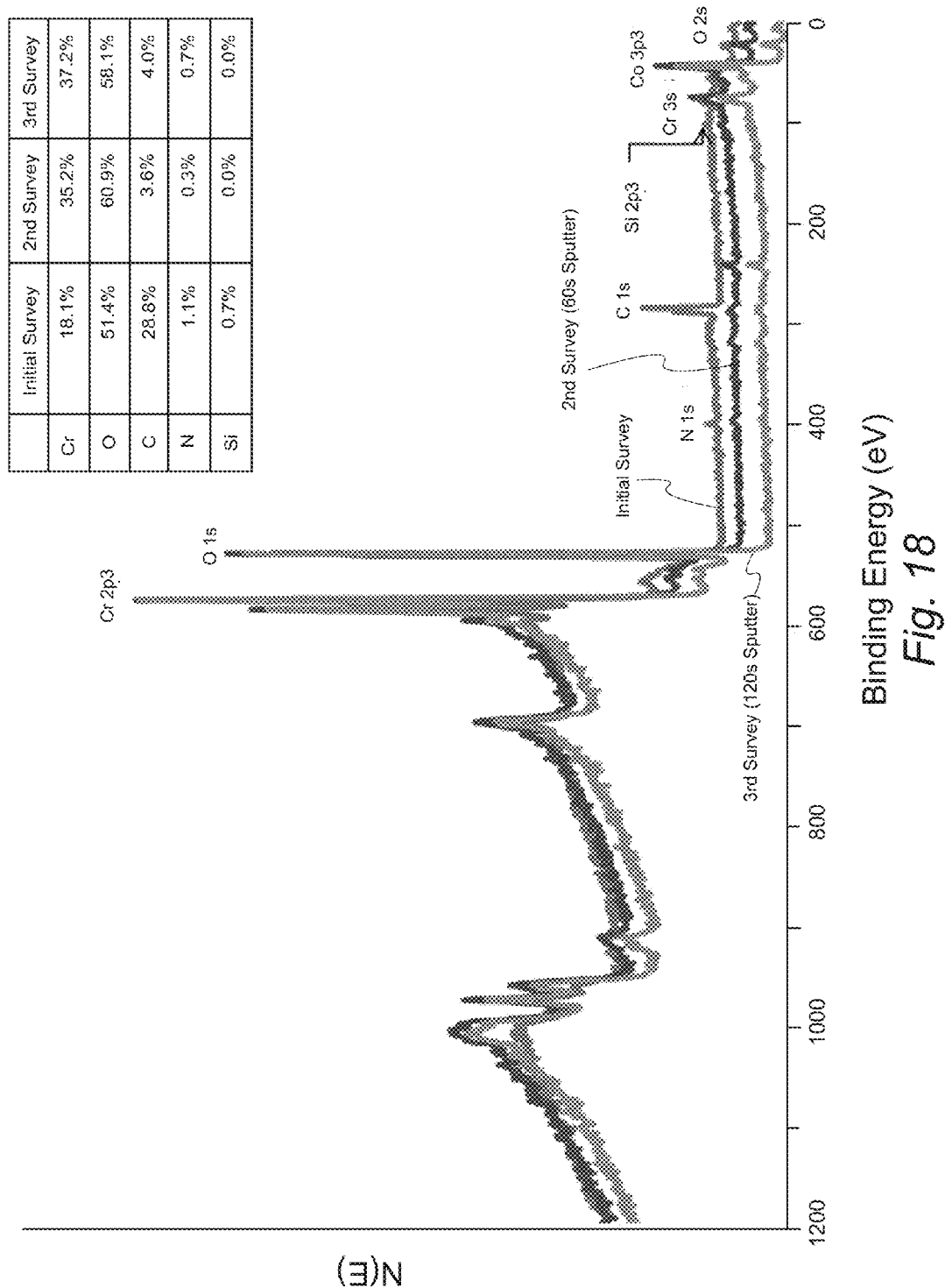
FIG. 18 provides XPS plots of a 124 nm thick chromium film deposited on thermal $SiO_2$ at 225° C. formed from $Cr(dad^{tBu2})_2$.
Figure 19:
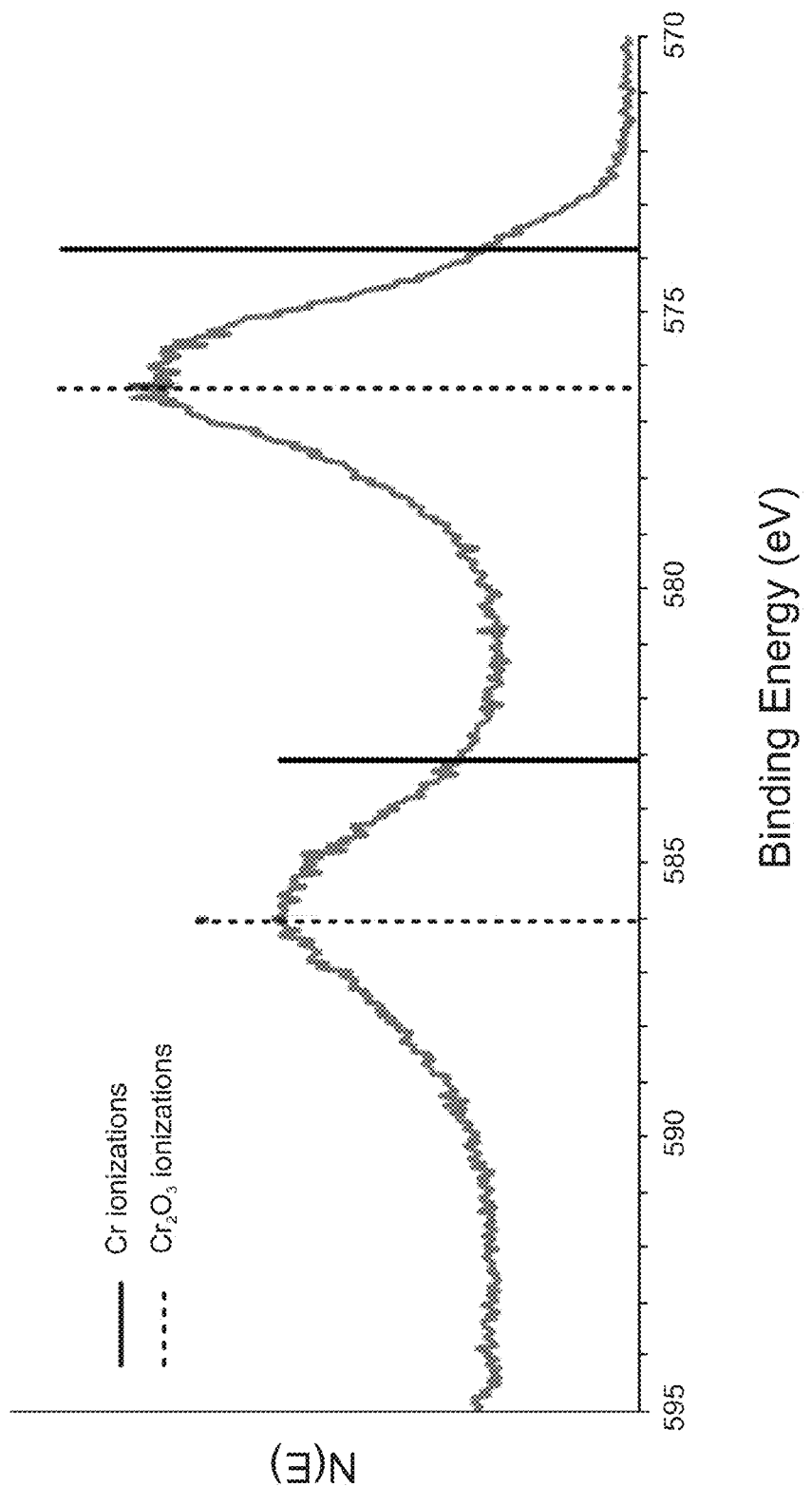
FIG. 19 provides an XPS high-resolution multiplex of the Cr 2p3 region of a film formed from $Cr(dad^{tBu2})_2$.
Figure 20:
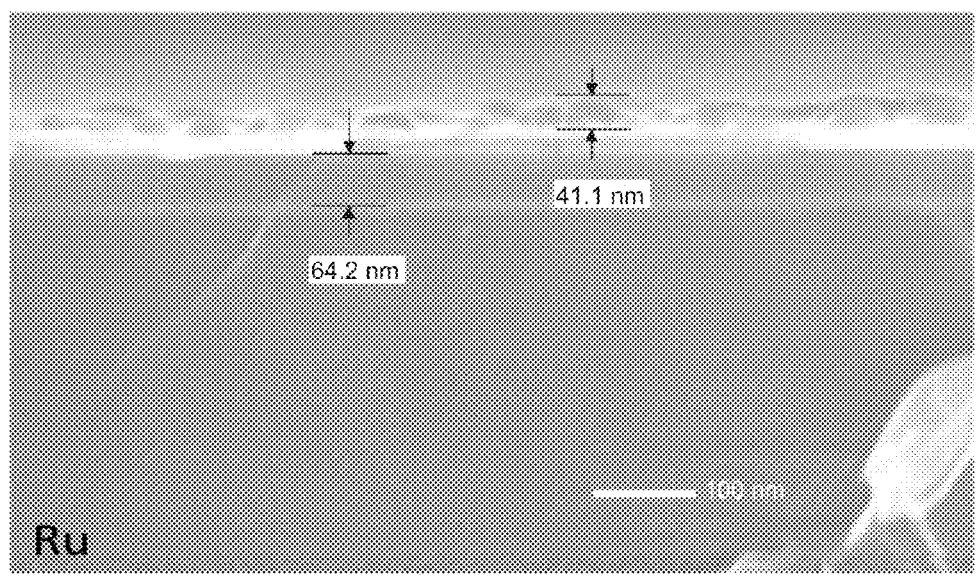
FIG. 20 provides a cross-sectional SEM micrograph of a manganese film on $Ru/SiO_2$ substrate formed from $Mn(dad^{tBu2})_2$.
Figure 21:
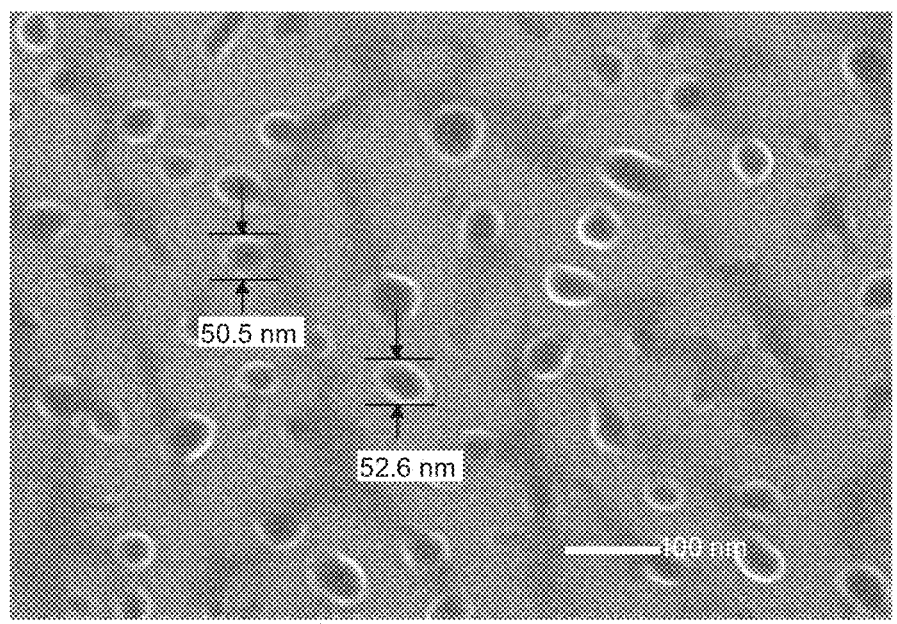
FIG. 21 provides a top-down SEM micrograph of a manganese film on $Ru/SiO_2$ substrate formed from $Mn(dad^{tBu2})_2$.
Figure 22:
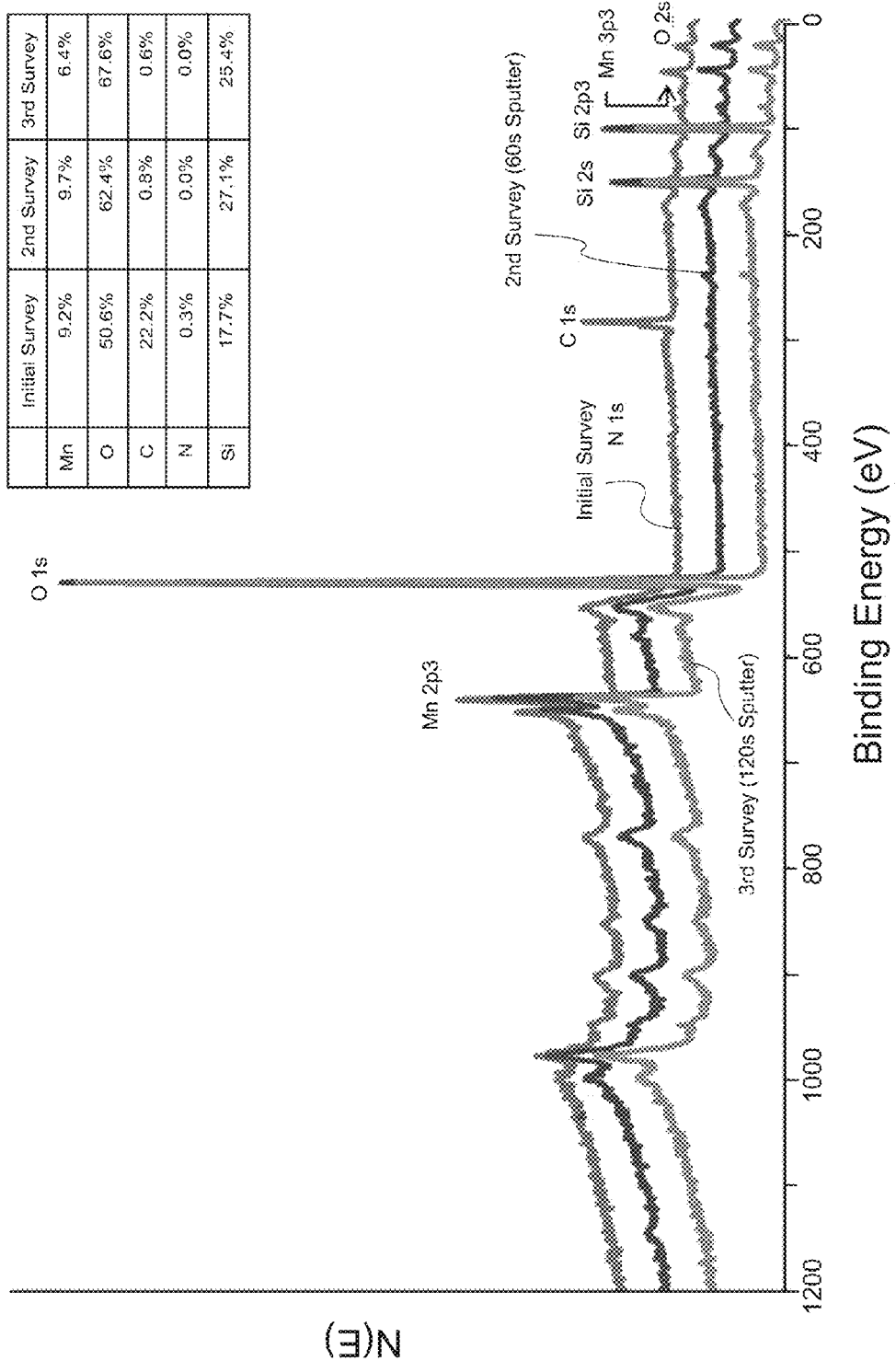
FIG. 22 provides XPS plots of a 27 nm manganese film deposited on $SiO_2$ at 225° C. formed from $Mn(dad^{tBu2})_2$.
Figure 23:
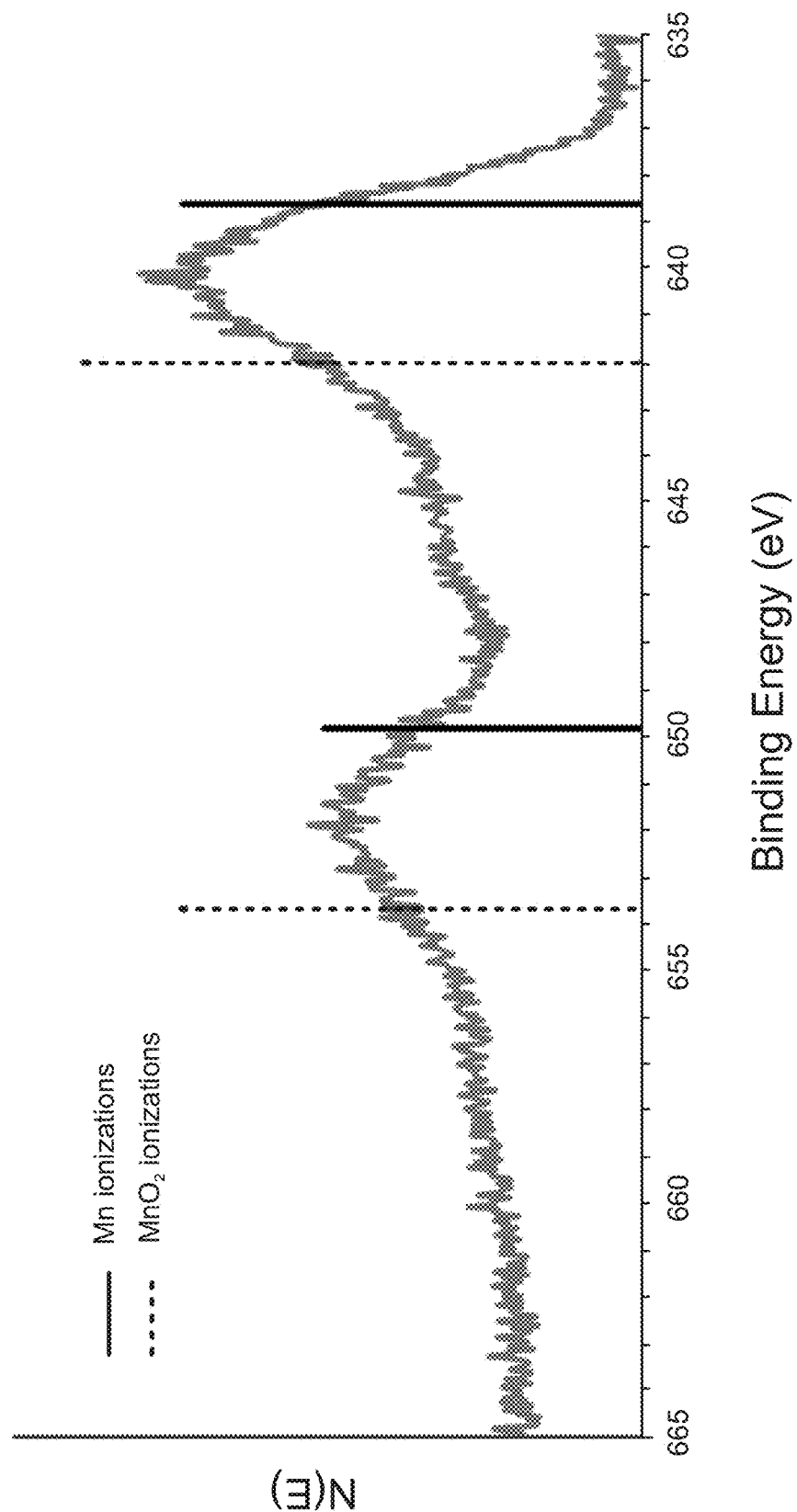
FIG. 23 provides a XPS high-resolution multiplex of the Mn 2p3 region of a film formed from $Mn(dad^{tBu2})_2$.
Figure 24:
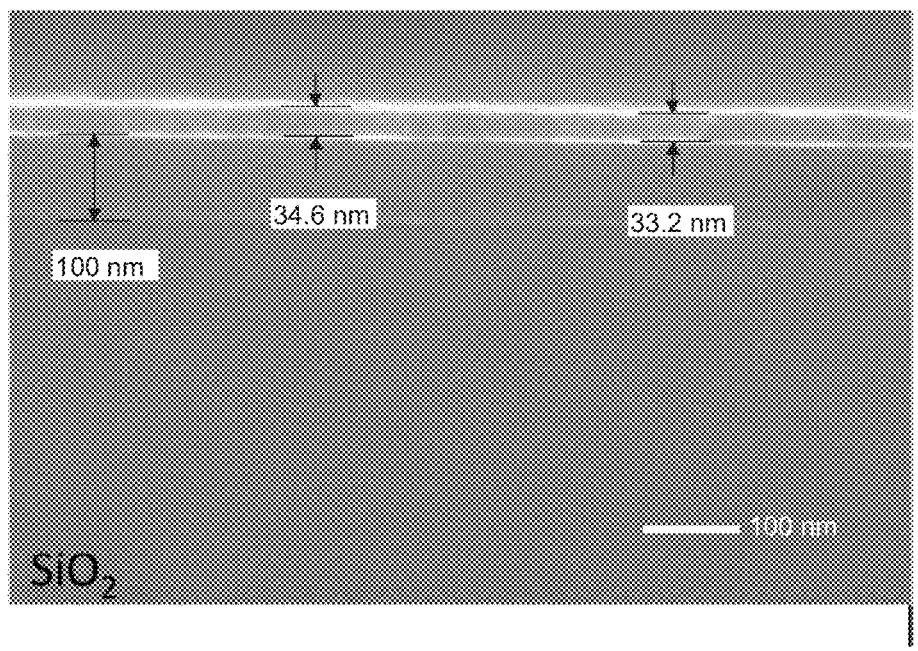
FIG. 24 provides cross-sectional SEM micrograph of an iron film on a thermal $SiO_2$ substrate formed from $Fe(dad^{tBu2})_2$.
Figure 25:
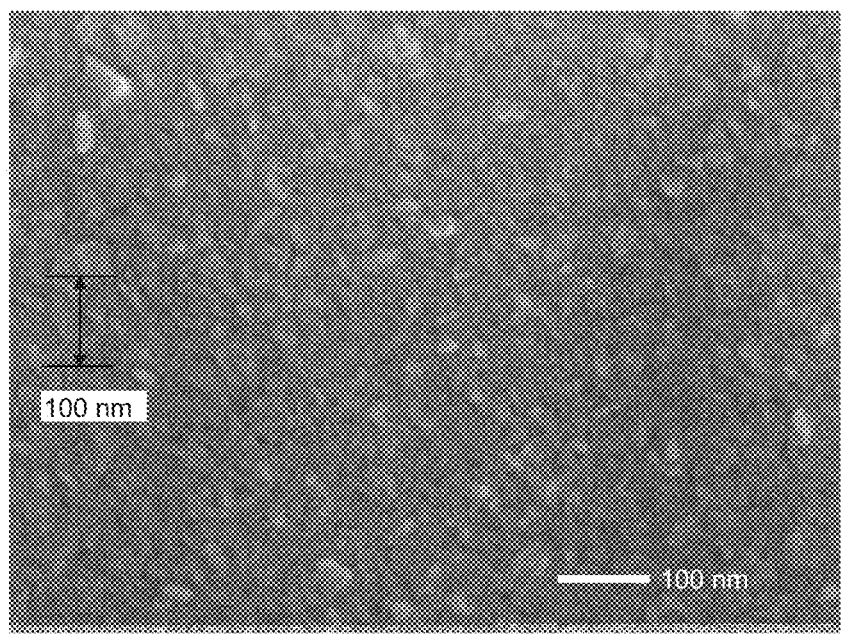
FIG. 25 provides a top-down SEM micrograph of an iron film on thermal $SiO_2$ formed from $Fe(dad^{tBu2})_2$.
Figure 26:
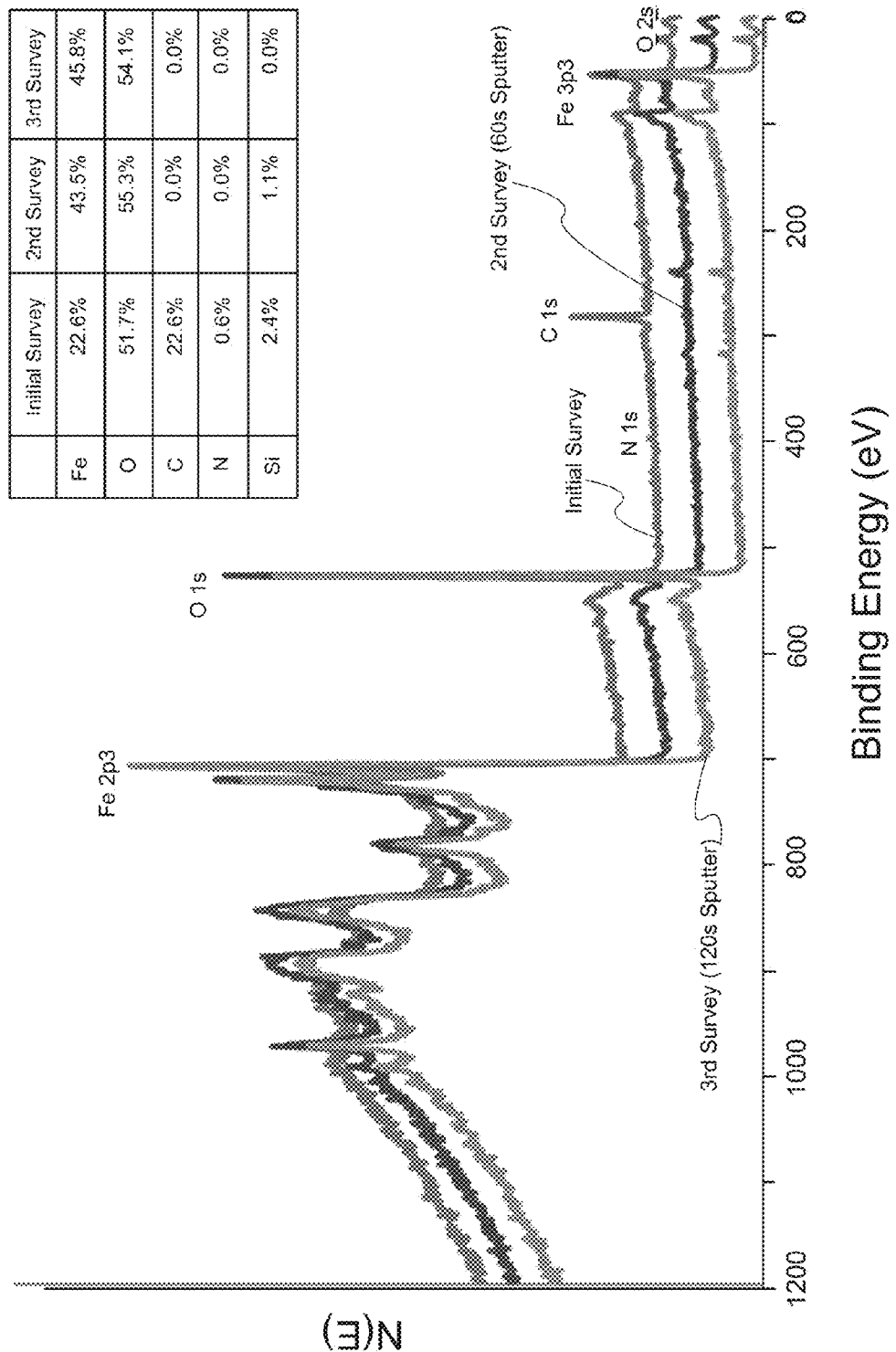
FIG. 26 provides XPS plots of a 35 nm thick iron film deposited on $Ru/SiO_2$ at 225° C. formed from $Fe(dad^{tBu2})_2$.
Figure 27:
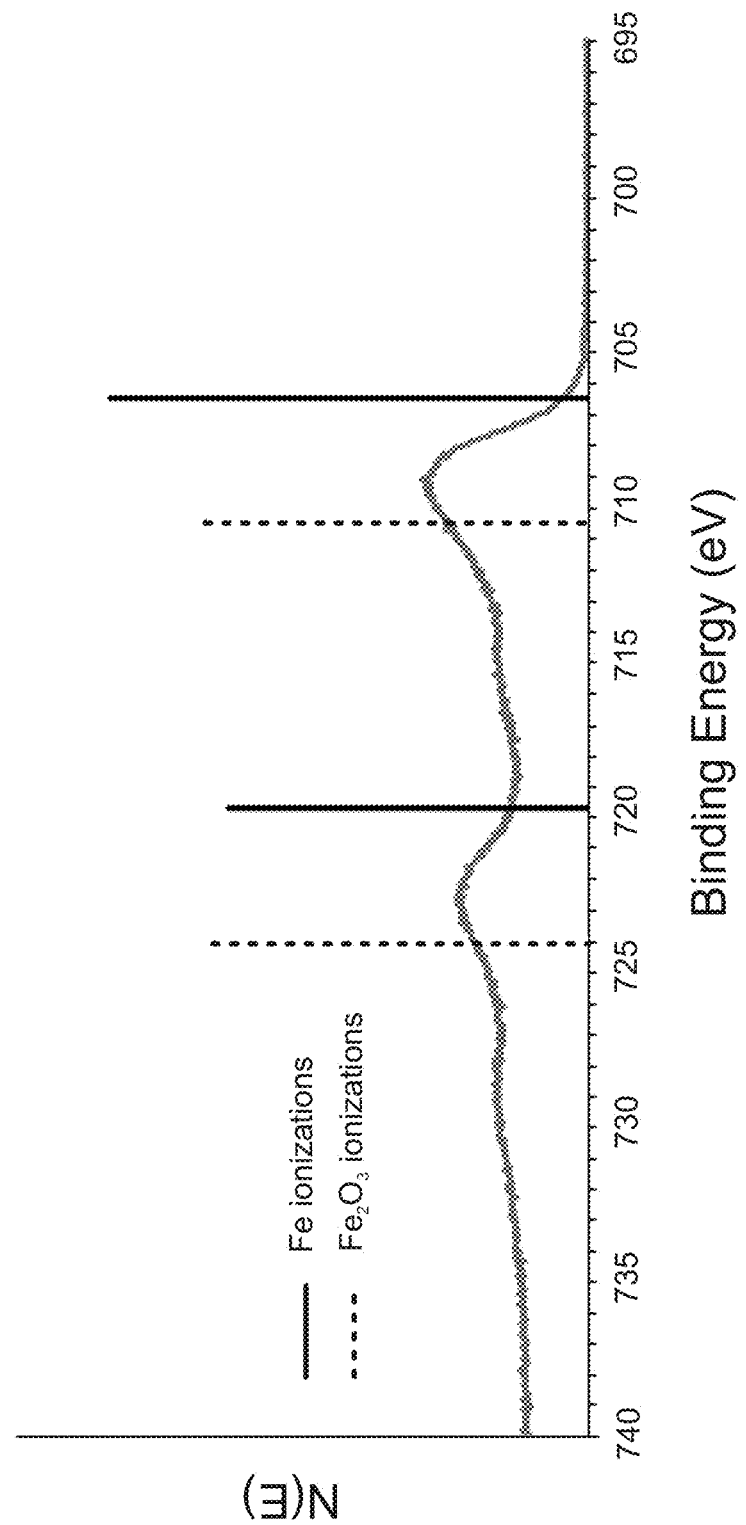
FIG. 27 provides a XPS high-resolution multiplex of the Fe 2p3 region of a film formed from $Fe(dad^{tBu2})_2$.
Figure 28:
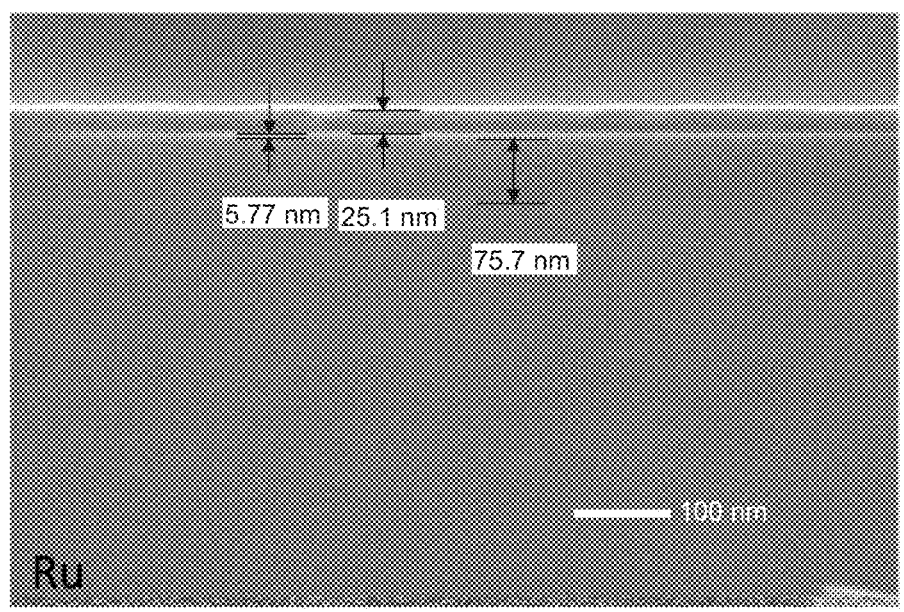
FIG. 28 provides a cross-sectional SEM micrograph of a cobalt film on a $Ru/SiO_2$ substrate formed from $Co(dad^{tBu2})_2$.
Figure 29:
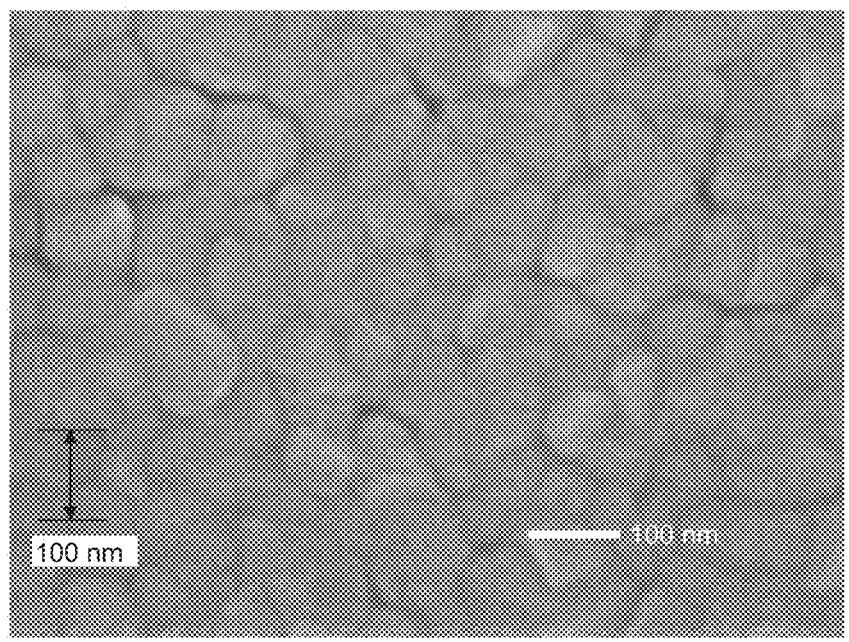
FIG. 29 provides an top-down SEM micrograph of cobalt film on thermal $SiO_2$ substrate formed from $Co(dad^{tBu2})_2$.
Figure 30:
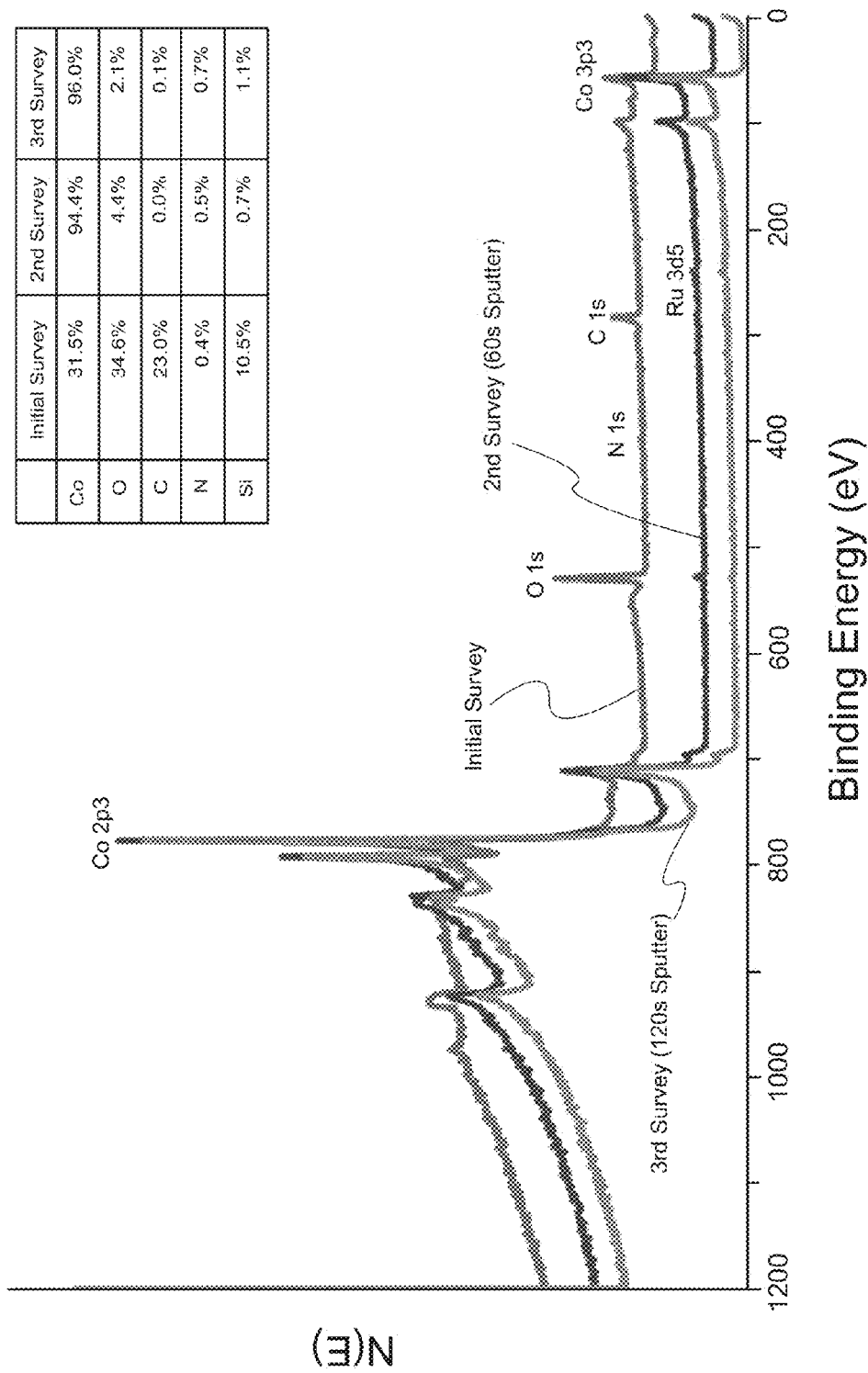
FIG. 30 provides XPS plots of 24 nm thick cobalt film deposited on $Ru/SiO_2$ at 180° C. from $Co(dad^{tBu2})_2$.
Figure 31:
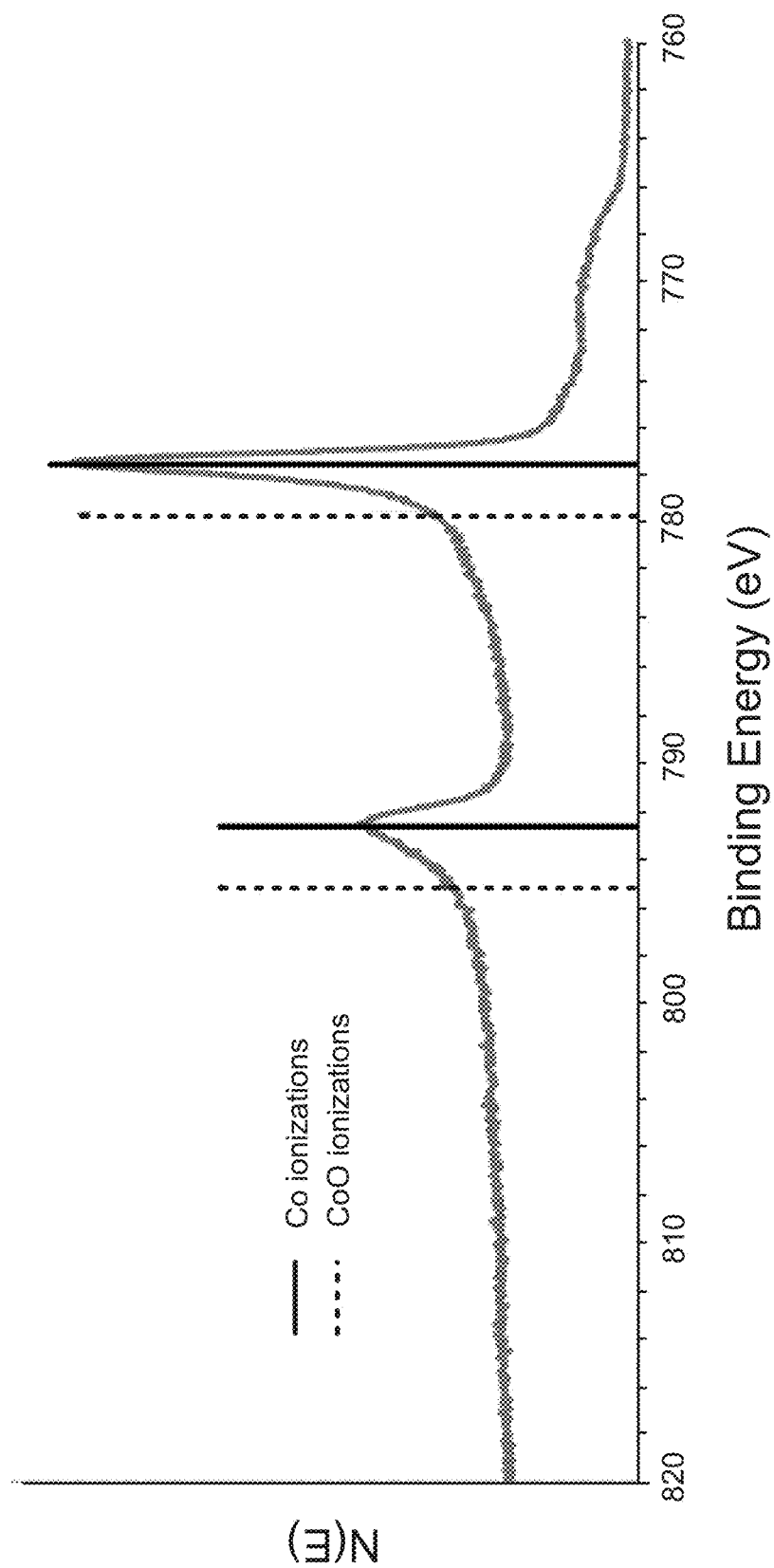
FIG. 31 provides a XPS high-resolution multiplex of the Co 2p3 region of a film formed from $Co(dad^{tBu2})_2$.
Figure 32:
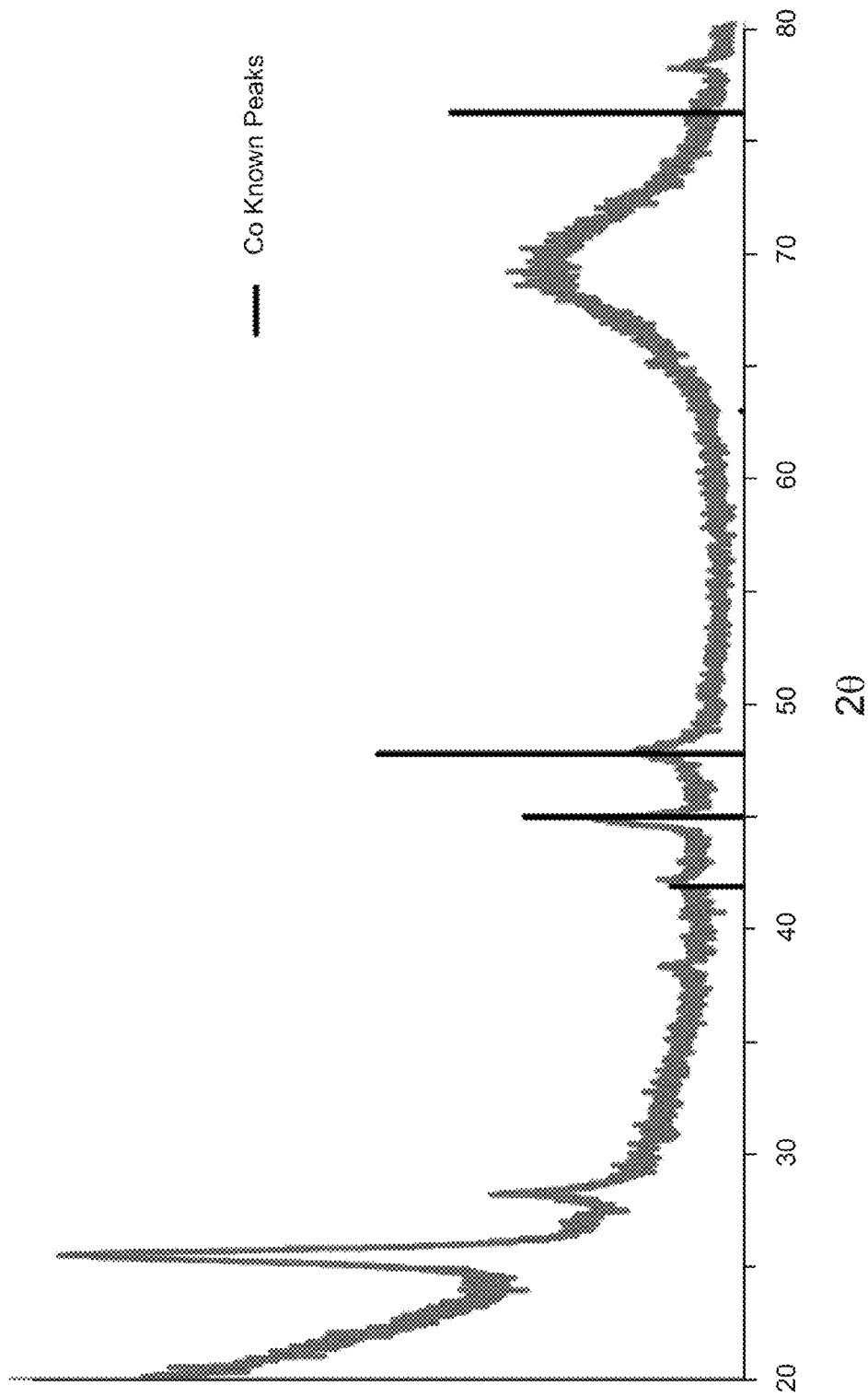
FIG. 32 provides an X-ray diffraction spectrum of showing cobalt metal on a $Ru/SiO_2$ substrate formed from $Co(dad^{tBu2})_2$.
Figure 33:
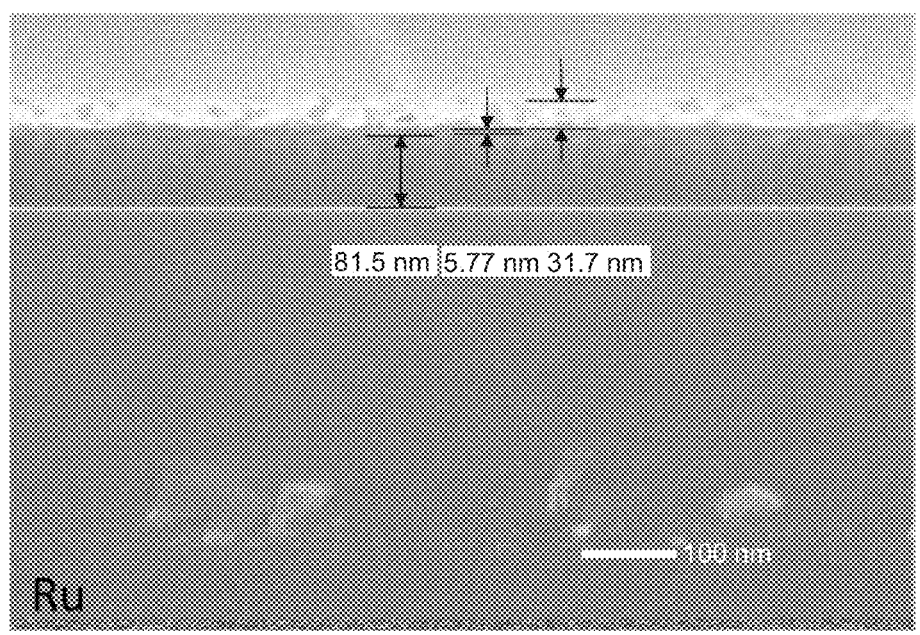
FIG. 33 provides a cross-sectional SEM micrograph of a nickel film on a $Ru/SiO_2$ substrate formed from $Ni(dad^{tBu2})_2$.
Figure 34:
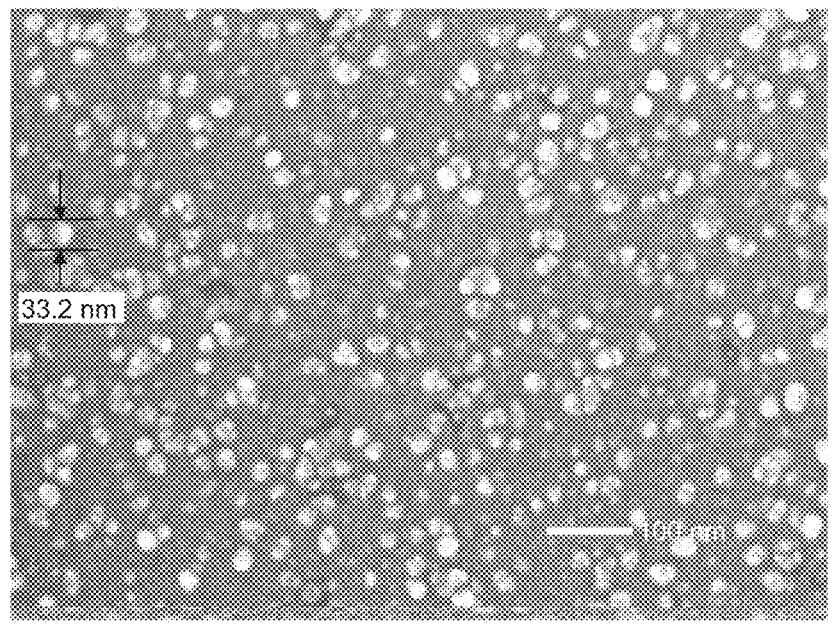
FIG. 34 provides a top-down SEM micrograph of a nickel film on a copper substrate formed from $Ni(dad^{tBu2})_2$.
Figure 35:
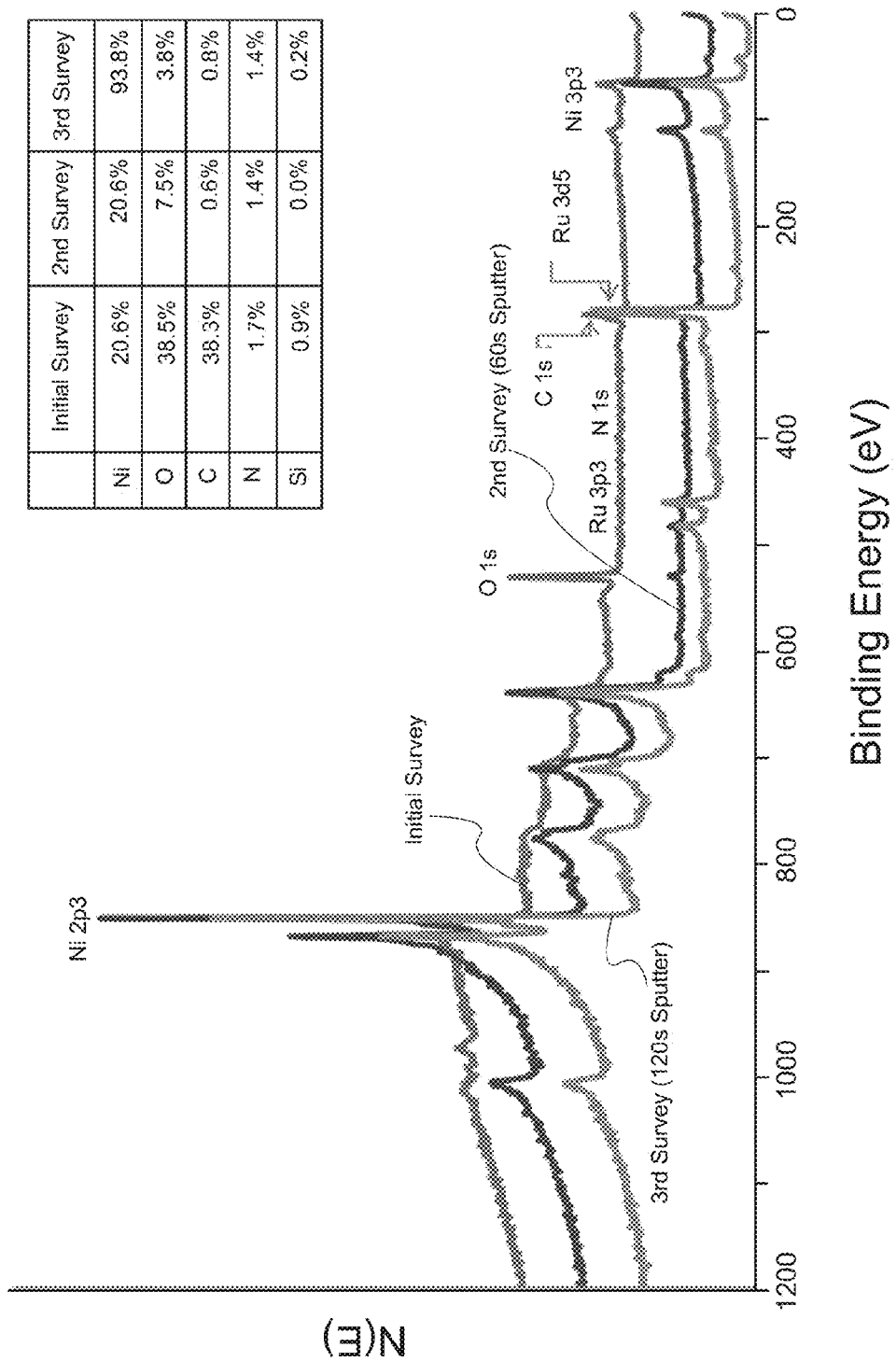
FIG. 35: XPS plots of a 34 nm thick nickel film deposited on $Ru/SiO_2$ at 180° C. from $Ni(dad^{tBu2})_2$.
Figure 36:
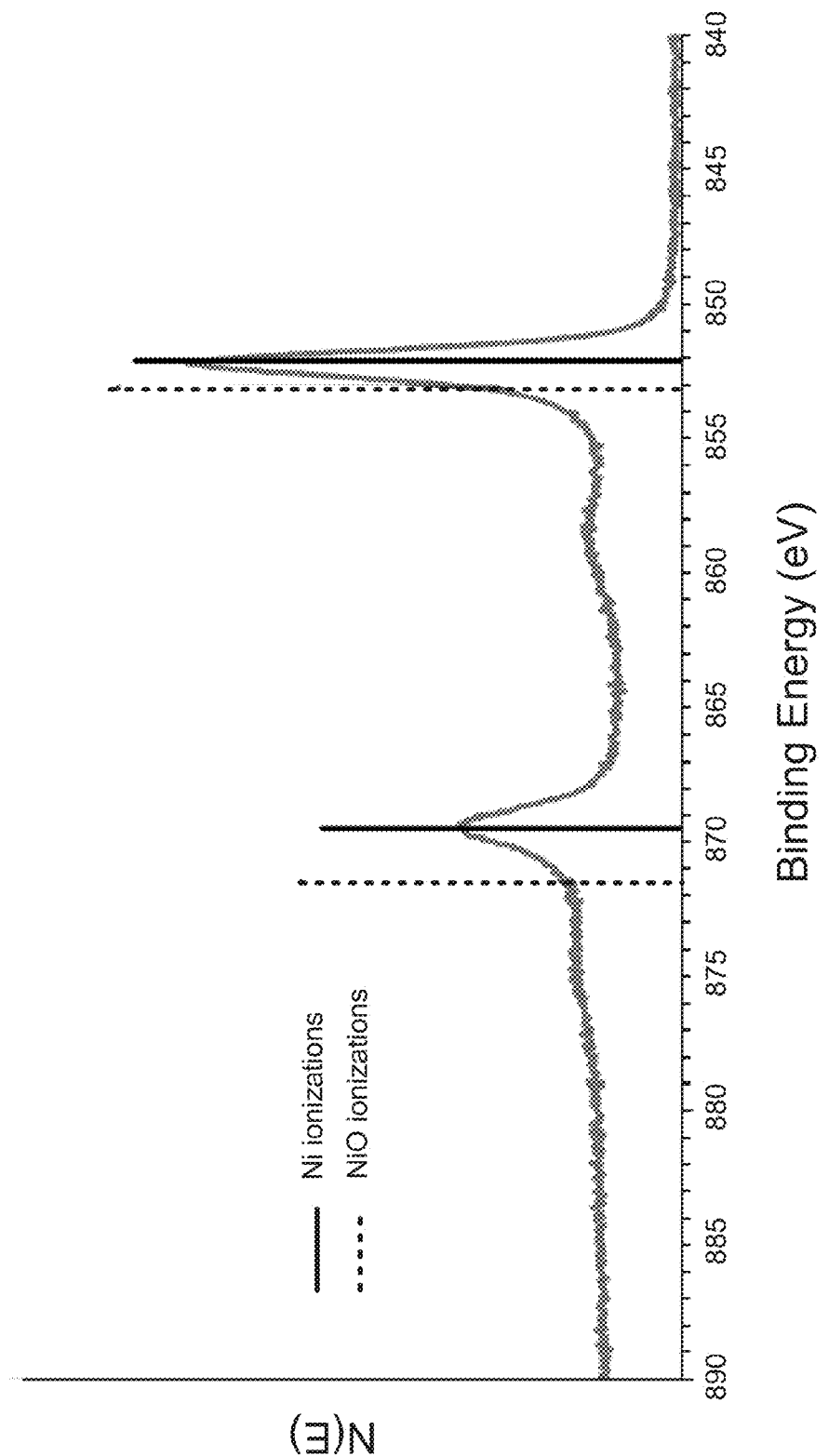
FIG. 36: XPS high-resolution multiplex of the Ni 2p3 region for a film formed from $Ni(dad^{tBu2})_2$.

Solution reactions were conducted with a variety of metal salts in THF. Upon refluxing, 1,4-bis(trimethylsilyl)-1,4-dihydropyrazine resulted in the formation of precipitates from Cu, Ni, Co, Fe, Zn, and Cr salts (Table 3). Copper precipitates were observed as regions of copper-colored film on the flasks and metallic flakes in solution, while cobalt and iron precipitated out as the ferromagnetic metals, sticking to the stir bar. The precipitate resulting from the reaction of copper bis(2,2,6,6-tetramethyl-3,5-heptanedionate) [Cu(tmhd)$_2$] with 1,4-bis(trimethylsilyl)-1,4-dihydropyrazine was identified as copper metal by X-ray diffractometry (FIG. 7).

TABLE 3

Reaction matrix of metal salts with 1,4-bis(trimethylsilyl)-1,4-dihydropyrazine

| ML$_2$ | THF | Reaction Temp | Time (min) | Reflux Temp | Time (min) | Reaction solution → Precipitate |
|---|---|---|---|---|---|---|
| Cu(dmap)$_2$ | 50 ml | RT | 15 | 65° C. | 60 | Cu flakes; Cu & green residue on flask |
| Cu(tmhd)$_2$ | 70 ml | RT | 30 | 65° C. | 95 | Cu & green flakes; Cu & purple residue on flask |
| NiCl$_2$ | 50 ml | RT | 15 | 65° C. | 70 | Tan powder |
| CoCl$_2$ | 40 ml | RT | 35 | 65° C. | 60 | Dark green powder at RT (sticks to stir bar) |
| FeCl$_2$ | 60 ml | RT | 35 | 65° C. | 60 | Film on flask; black powder (sticks to stir bar) |
| ZnCl$_2$ | 75 ml | RT | 15 | 65° C. | 60 | Few metallic flakes → white precipitate after about 3 days |
| CrCl$_2$ | 70 ml | RT | 23 | 65° C. | 60 | Silver-colored flakes → grey suspension |
| MnCl$_2$ | 50 ml | RT | 15 | 65° C. | 60 | None |

A binary process using Cu(dmap)$_2$ and 1,4-bis(trimethylsilyl)-1,4-dihydropyrazine at 150° C. failed to produce films on any substrates (Si(100), SiH, thermal SiO$_2$, Cu, Pt, Pd, TiN, and Ru/SiO$_2$, Co/SiO$_2$). A three-step process was subsequently attempted, whereby formic acid was used to produce the metal formate, which was then reduced to copper metal by 1,4-bis(trimethylsilyl)-1,4-dihydropyrazine. Numerous precursors were used, including Cu and Ni(dmap)$_2$ and various metal 1,4-di-tert-butyldiazadiene complexes [M(dad$^{tBu2}$)$_2$]. Each deposition cycle consisted of a precursor pulse (3.0 s for M(dmap)$_2$ and 6.0 s for M(dad$^{tBu2}$)$_2$), a 5.0 s purge, a 0.2 s pulse of formic acid, a 5.0 s purge, a 1.0 s pulse of 1,4-bis(trimethylsilyl)-1,4-dihydropyrazine, and a final 10.0 s purge. Booster temperatures were maintained at 100° C. and 150° C. for M(dmap)$_2$ and M(dad$^{tBu2}$)$_2$ precursors, respectively. Bubbler temperatures were maintained at 70° C. and 21° C. for 1,4-bis(trimethylsilyl)-1,4-dihydropyrazine and formic acid, respectively. Selected films from each deposition were characterized by SEM, XRD, and X-ray photoelectron spectroscopy (XPS) as provided by FIGS. 8-36.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

REFERENCES

1. Laguerre, M.; Dunogues, J.; Calas, R.; Duffaut, N. *J. Organomet. Chem.* 1976, 112, 49-59.
2. Hausen, H. D.; Mundt, O.; Kaim, W. *J. Organomet. Chem.* 1985, 296, 321-337.
3. Kaim, W. *J. Am. Chem. Soc.* 1983, 105, 707-713
4. Sulzbach, R. A.; Iqbal, A. F. M. *Angew. Chem. Int. Ed. Engl.* 1971, 10, 127

What is claimed is:

1. A method comprising:
   a) reacting a first compound having a metal atom in an oxidized state with a reducing agent to convert the metal atom to a zero oxidation state, the metal atom selected from the group consisting of Groups 2 to 12 of the Periodic Table, As, Sb, Bi, Se, and Te to the reducing agent selected from the group consisting of compounds described by formulae IA and IB:

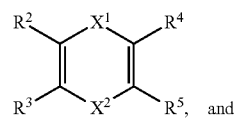

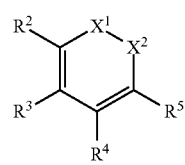

wherein:
X$^1$ is CR$^6$(SiR$^1$R$^{1'}$R$^{1''}$) or N(SiR$^1$R$^{1'}$R$^{1''}$);
X$^2$ is CR$^7$(SiR$^1$R$^{1'}$R$^{1''}$) or N(SiR$^1$R$^{1'}$R$^{1''}$); and
R$^1$, R$^{1'}$, R$^{1''}$, R$^2$, R$^3$, R$^4$, R$^5$, R$^6$, and R$^7$ are each independently H, C$_{1-10}$ alkyl, C$_{6-14}$ aryl, or C$_{4-14}$ heteroaryl.

2. The method of claim 1 wherein R$^1$, R$^{1'}$, R$^{1''}$ are each independently C$_{1-10}$ alkyl; R$^2$, R$^3$, R$^4$, R$^5$ are each independently H or C$_{1-10}$ alkyl; and R$^6$ and R$^7$ are H.

3. The method of claim 1 wherein the reducing agent is selected from the group consisting of:

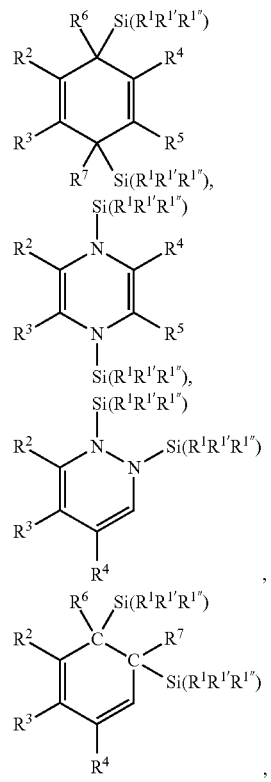

and combinations thereof.

4. The method of claim 3 wherein R$^1$, R$^{1'}$, R$^{1''}$ are each independently C$_{1-10}$ alkyl; R$^2$, R$^3$, R$^4$, R$^5$ are each independently H or C$_{1-10}$ alkyl; and R$^6$, and R$^7$ are H.

5. The method of claim 4 wherein the reducing agent is:

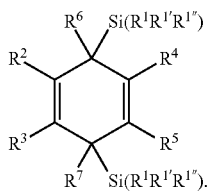

6. The method of claim 1 wherein the metal atom in an oxidized state is in an oxidation state of 1, 2, 3, 4, 5, or 6.

7. The method of claim 1 wherein $R^2$, $R^3$, $R^4$, and $R^5$ are each independently hydrogen, methyl, ethyl, n-propyl, isopropyl, n-butyl, sec-butyl, isobutyl, t-butyl, or phenyl.

8. The method of claim 1 wherein $R^1$, $R^{1'}$, and $R^{1''}$ are each independently hydrogen, methyl, ethyl, n-propyl, isopropyl, n-butyl, sec-butyl, isobutyl, t-butyl, or phenyl.

9. The method of claim 1 wherein the metal atom is Cu, Cr, Mn, Fe, Co, or Ni.

10. The method of claim 1 comprising a deposition cycle including:
  a) contacting a substrate with a vapor of the first compound having a metal atom in an oxidized state to form a first modified surface; and
  c) contacting the first modified surface with the reducing agent.

11. The method of claim 10 wherein a metal-containing layer is deposited on the substrate.

12. The method of claim 10 wherein the reducing agent is described by formula (IIA):

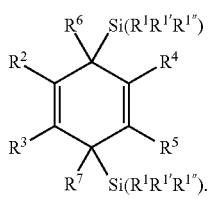

IIA

13. The method of claim 10 wherein the substrate is additionally contacted with the vapor of the first compound having a metal atom in an oxidized state and then the vapor of a reducing agent during a plurality of additional deposition cycles.

14. The method of claim 13 wherein the substrate is coated with from 1 to 5000 deposition cycles.

15. The method of claim 10 wherein the substrate is coated at a temperature from about 50 to 400° C.

16. The method of claim 10 wherein the substrate is contacted with a purge gas after contacting the substrate with vapor of a metal-containing compound including a metal atom in an oxidized state and before contacting the substrate with the vapor of the reducing agent.

17. The method of claim 16 wherein the substrate is contacted with the purge gas after contacting the substrate with the vapor of the reducing agent and before a subsequent step of contacting vapor of a metal-containing compound including a metal atom in an oxidized state.

18. The method of claim 10 wherein the first compound having a metal atom in an oxidized state is reacted with the reducing agent in a gaseous state.

19. A method of forming a layer on a substrate, the method comprising a deposition cycle including:
  a) contacting a substrate with a vapor of a first compound having a metal atom in an oxidized state to form a first modified surface, the metal atom in an oxidized state selected from the group consisting of Groups 1 to 12 of the Periodic Table, As, Sb, Bi, Se, and Te;
  b) contacting the first modified surface with an acid for a second predetermined pulse time to form a second modified surface; and
  c) contacting the second modified surface with a reducing agent for a third predetermined pulse time to form a layer on the substrate, the layer including the metal atom in a zero oxidation state, the reducing agent selected from the group consisting of:

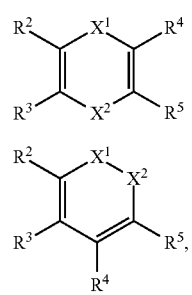

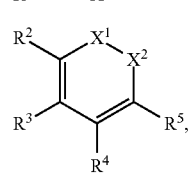

wherein:

$X^1$ is $CR^6(SiR^1R^{1'}R^{1''})$ or $N(SiR^1R^{1'}R^{1''})$;

$X^2$ is $CR^7(SiR^1R^{1'}R^{1''})$ or $N(SiR^1R^{1'}R^{1''})$; and $R^1$, $R^{1'}$, $R^{1''}$, $R^2$, $R^3$, $R^4$, $R^5$, $R^6$, and $R^7$ are each independently H, $C_{1-10}$ alkyl, $C_{6-14}$ aryl, or $C_{4-14}$ heteroaryl.

20. The method of claim 19 wherein the metal atom is Cu, Cr, Mn, Fe, Co, or Ni.

21. The method of claim 19 wherein the reducing agent comprises a compound selected from the group consisting of:

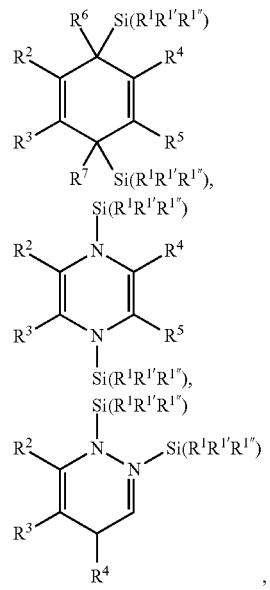

-continued

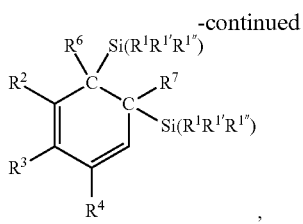

and combinations thereof.

22. The method of claim 19 wherein the reducing agent is:

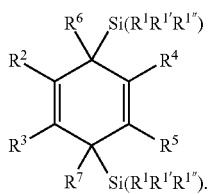

23. The method of claim 19 wherein the metal atom in an oxidized state is in an oxidation state of 1, 2, 3, 4, 5, or 6.

24. The method of claim 19 wherein $R^1$, $R^{1'}$, $R^{1'''}$ are each independently $C_{1-10}$ alkyl; $R^1$, $R^2$, $R^3$, $R^4$, $R^5$ are each independently H or $C_{1-10}$ alkyl; and $R^6$, and $R^7$ are H.

25. The method of claim 19 wherein $R^1$, $R^{1'}$, $R^{1'''}$ are each independently methyl, ethyl, n-propyl, isopropyl, n-butyl, sec-butyl, isobutyl, or t-butyl and $R^2$, $R^3$, $R^4$, and $R^5$ are each independently hydrogen, methyl, ethyl, n-propyl, isopropyl, n-butyl, sec-butyl, isobutyl, or t-butyl.

26. The method of claim 19 wherein the substrate is additionally contacted with the vapor of the first compound having a metal atom in an oxidized state, the acid, and the vapor of a reducing agent during a plurality of additional deposition cycles.

* * * * *